(12) United States Patent
Aizawa et al.

(10) Patent No.: US 7,583,309 B2
(45) Date of Patent: Sep. 1, 2009

(54) IMAGING DEVICE PACKAGE CAMERA MODULE AND CAMERA MODULE PRODUCING METHOD

(75) Inventors: Mitsuaki Aizawa, Tokyo (JP); Hiroki Itoh, Tokyo (JP); Masanobu Nakai, Tokyo (JP)

(73) Assignee: Kyocera Coproration, Fushimi-ku, Kyoto-shi, Kyoto (JP)

( * ) Notice: Subject to any disclaimer, the term of this patent is extended or adjusted under 35 U.S.C. 154(b) by 1230 days.

(21) Appl. No.: 10/609,773

(22) Filed: Jun. 27, 2003

(65) Prior Publication Data

US 2004/0095501 A1 May 20, 2004

(30) Foreign Application Priority Data

| Jun. 28, 2002 | (JP) | ............................. 2002-188942 |
| Nov. 21, 2002 | (JP) | ............................. 2002-337533 |
| Jan. 31, 2003 | (JP) | ............................. 2003-024249 |
| Feb. 27, 2003 | (JP) | ............................. 2003-051230 |

(51) Int. Cl.
  *H04N 5/225* (2006.01)
(52) U.S. Cl. .................................................... 348/340
(58) Field of Classification Search ................ 348/335, 348/340
  See application file for complete search history.

(56) References Cited

U.S. PATENT DOCUMENTS

| 4,594,613 | A | * | 6/1986 | Shinbori et al. ............. 348/340 |
| 5,040,069 | A | * | 8/1991 | Matsumoto et al. ........... 348/76 |
| 6,762,796 | B1 | * | 7/2004 | Nakajoh et al. ............. 348/340 |
| 2007/0285555 | A1 | * | 12/2007 | Chen ........................ 348/340 |

FOREIGN PATENT DOCUMENTS

| EP | 1081944 A2 | 7/2001 |
| JP | A-63-55795 | 3/1988 |
| JP | A-113554769 | 12/1999 |
| JP | A-2000-295503 | 10/2000 |
| JP | 2001-78064 | 3/2001 |

(Continued)

OTHER PUBLICATIONS

Translation of JP 11-354769.*
English Abstract for publication No. JP11354769.
Partial translation of cited Japanese applications listed on p. 1 of this form.

*Primary Examiner*—Tuan V Ho
(74) *Attorney, Agent, or Firm*—Schulte Roth & Zabel LLP; John C. Garces

(57) ABSTRACT

An IR cut-filter is fitted into a support portion within the optical-system containing portion of a ceramic board and a lens 11 is mounted in the ceramic board by screwing the lens.

In an imaging-device containing portion, an imaging device with a light receiving portion arranged therein is mounted outside the support portion by flip-chip packaging. Further, the vicinity of the flip-chip packaging portion is sealed with resin.

Additionally, on the base of the imaging-device containing portion of a ceramic package, the lands of an imaging device are so positioned as to correspond to the respective land positions of a ceramic package and patterns are electrically connected by melting a gold bump, whereby the imaging device is mounted by bare-chip packaging. The land portion is filled with an underfill agent and then sheet glass is mounted on a through-hole 5b and sealed with a sealing agent, so that the through-hole 5b for containing a light receiving portion is sealed up.

5 Claims, 20 Drawing Sheets

FOREIGN PATENT DOCUMENTS

| | | |
|---|---|---|
| JP | 2001-111873 | 4/2001 |
| JP | 2001-119006 | 4/2001 |
| JP | 2001-128072 | 5/2001 |
| JP | A-2002-051268 | 2/2002 |

* cited by examiner

FIG. 11
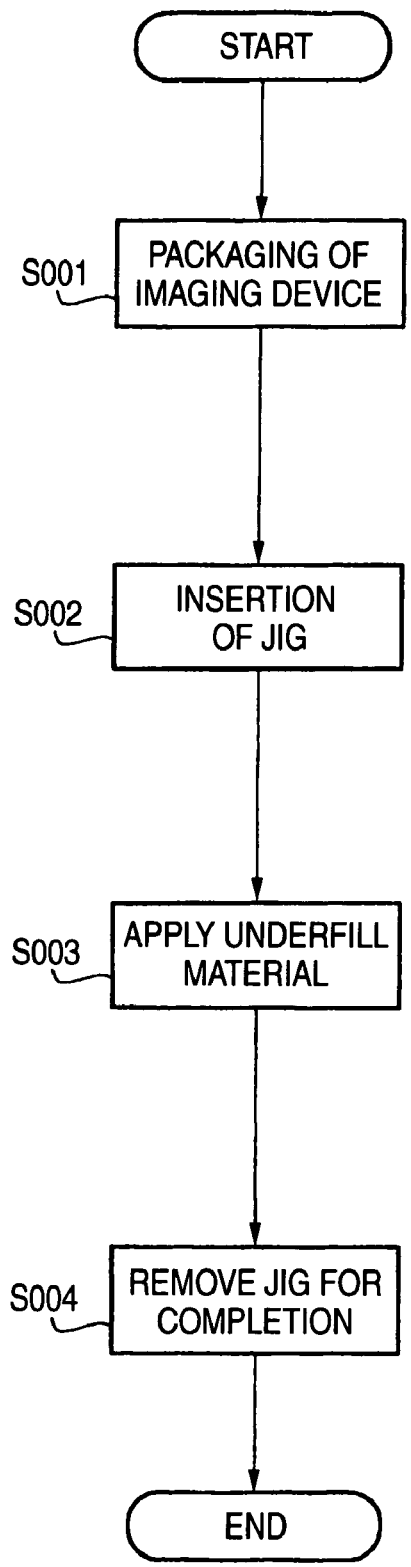
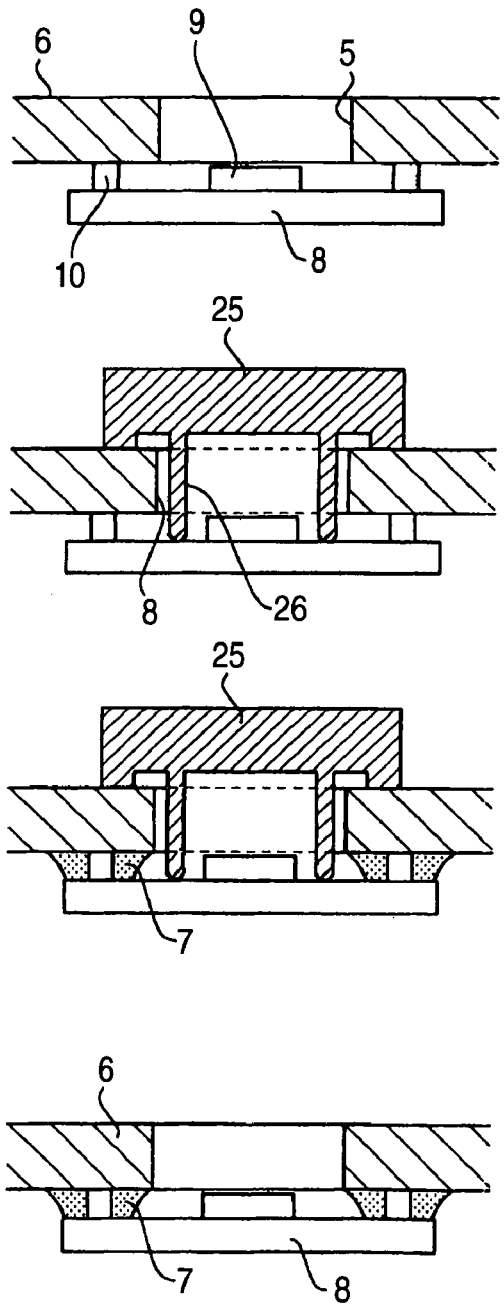

| SYMBOL | TERMINAL |
|---|---|
| $V_{DD}$ | POWER SUPPLY VOLTAGE |
| GND | GND |
| PG | RESET GATE |
| PD | RESET DRAIN |
| $V_{OUT}$ | CCD OUTPUT |
| $V_1$-$V_3$ | IMAGING PORTION TRANSMISSION CLOCK |
| NSUB | BOARD BIAS |
| $P_1$-$P_3$ | STORAGE PORTION TRANSMISSION CLOCK |
| $H_1$-$H_2$ | HORIZONTAL PORTION TRANSMISSION CLOCK |

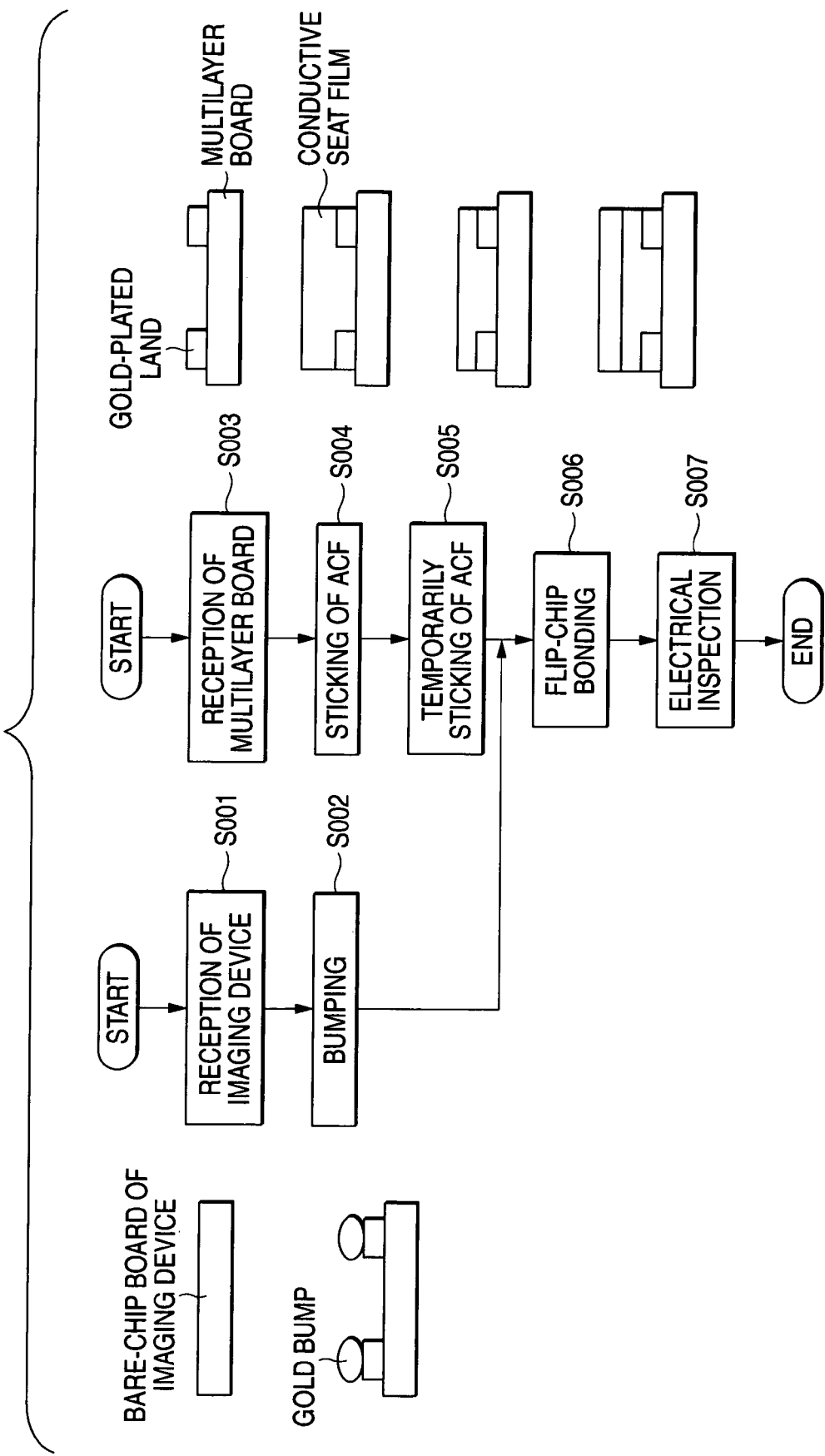

PRIOR ART

PRIOR ART

IMAGING DEVICE PACKAGE CAMERA MODULE AND CAMERA MODULE PRODUCING METHOD

BACKGROUND OF THE INVENTION

The present invention relates to an imaging device package for use in a portable communication apparatus such as a mobile telephone, a portable information terminal such as a PDA, a digital camera and so forth, to a camera module and a camera using such a package and to a camera module producing method.

The present invention relates to a structure in which a bare semiconductor chip board such as a CCD imaging device is mounted on a circuit board as well.

Camera modules contained in mobile telephones such as portable telephones are required to be small-sized. It has so far been studied to mainly reduce the size in the x-y (plane) direction. With portable telephones being increasingly multi-functioned, however, camera blocks must be reduced in size and thickness as liquid crystal display units are replaced with EL elements.

JP-A-2001-128072 discloses a camera module wherein improvement has been embodied in its thickness.

FIG. 24 is a sectional view of a conventional camera module of the sort mentioned above.

As shown in FIG. 24, a lens barrel 69 fitted with a lens 71 and an optical filter 70 is fixedly screwed into a holder.

A metal plate 64 having a hole is bonded onto a flexible board 74 similarly having a hole and the holder 68 is fixed onto the metal plate 64. An imaging device 61 having a light receiving portion 65 is fitted to the undersurface of the flexible board 74. A bump 66 is formed on and attached by pressure to the electrode portion of the imaging device 61 and a sealing resin (underfill material) 67 is applied onto the bump 66.

In the example shown in FIG. 24, though the underfill material is thus used for shielding the imaging device and increasing the adhering strength of the imaging device to the board, there is the possibility of causing the underfill material to flow into the light receiving portion.

A lens unit including the lens, the lens barrel and the holder in the above example is designed for exclusive use from time to time in order to meet the specification required and this may adversely affect development efficiency. Since the lens unit 62 is arranged such that it is bonded onto the metal plate 64, the work of positioning the optical filter 70 and the lens 71 with precision will be needed.

When an imaging device is mounted on a board having a through-hole by bare-chip packaging, an underfill material is normally employed in order to not only decrease the deformation of the bare-chip packaging portion by structurally combining the imaging device and the board together after the bare-chip packaging but also reduce shear stress applied to a solder joint (stress relaxation).

In such a case as this, it is needed- to prevent the underfill material from flowing into the light receiving portion of the imaging device.

In this case, importance should be attached to letting the underfill material used between the imaging device and the board of a camera module function as a sealing material for sealing up the camera module so that no dust is introduced into the interior after the completion of the camera module, in addition to decreasing the deformation as well as reducing the shear stress. The underfill material is often prepared from epoxy as a base, which is mixed with a filler or the like as occasion demands in consideration of viscosity, adhesion, fast effectiveness, moisture proofness, hardening propensity, cost and so forth (e.g., fluid epoxy resin, one-component epoxy resin, etc.). Moreover, a different kind of underfill material is chosen, depending on the material of the board. In case that the board is formed of epoxy resin or ceramics, for example, an underfill material of epoxy series is employed and in case that the board is formed of polyimide series, an underfill material of polyimide series is employed then.

As the underfill material is prevented from flowing in by forming a projection on the ceramic board, there develops a problem arising from an increase in the cost of manufacturing ceramic boards. Another conceivable method of preventing the underfill material from flowing in is to make the underfill material hard to flow by adding a solvent (filler) thereto as described above; however, the problem is that if the viscosity is thus raised, it will not only lower the workability but also push up the price of the underfill material itself.

Further, the camera module is made smaller in size through the method of directly mounting a bare chip on the board. FIG. 25 is a sectional and a partial plan view of the conventional imaging device package as shown by way of example. A ceramic package 35 has an imaging-device containing portion 35a having a stepped portion and an imaging device (bare chip) 32 is provided in the base portion of the imaging-device containing portion 35a. A light receiving portion 33 is disposed in the center of the imaging device 32 and a gold land 40b is formed at the front end of each pattern 40a electrically connected to the light receiving portion 33 and led out to the periphery of the imaging device.

Gold lands 40c are formed on the stepped portion 35b of the imaging-device containing portion 35a and connected to solder lands 36 formed on the side of the ceramic package 35 via patterns 40d. The gold lands 40b and 40c are electrically connected by wire bonding 41.

Sheet glass 39 is mounted on the ceramic package 35 and the imaging-device containing portion 35a is sealed up with a sealing compound.

As the structure (of FIG. 25) is built up by mounting the packaged imaging device on the board by wire bonding, it is possible to secure the reliability of mounting the imaging device on the board with measures taken to keep out dust; however, the structure has its drawback in that the length, breadth and height of the camera module tend to become greater with the wire-bonding space secured.

FIG. 26 is a diagram showing an arrangement of lands on the imaging device in bare-chip packaging by way of example. On the imaging device 32 lies a storage portion 43 and a light receiving portion 42 and lands for such as signal and power supply lines are disposed on both portions 42 and 43.

These lands form terminals as shown in FIG. 20 including in addition P-well and N-board connecting terminals, (6 pcs.) of terminals for supplying clock signals to imaging and storage portions, (2 pcs.) of terminals for supplying horizontal clock signals, a power supply terminal, a reset gate terminal, a reset drain terminal and a terminal for taking out CCD output.

In this bare-chip packaging structure, as the level of the signal from the CCD output, out of the signal lines of the imaging device, is extremely low, the feeble signal is liable to be affected by noise and another signal line.

It is therefore avoided as much as possible to have noise superposed on the feeble signal or allow another signal to interfere with the feeble signal by minimizing the wiring length, reducing the exposed portion and decreasing the inductance component by applying bare-chip packaging in between the ceramic board 36 and the imaging device 32.

As shown in FIG. 23A, however, noises 21a and 21b are actually superposed on the feeble video signal, so that the S/N ratio becomes difficult to raise.

In other words, though the S/N ratio is improved in the bare-chip packaging of the ceramic board 36 and the imaging device 32 but the improvement thereof is still insufficient.

SUMMARY OF THE INVENTION

An object of the invention intended to solve the foregoing problems is to provide a small-sized module camera designed to improve efficiency of assembly work, block an under fill material for sealing an imaging device in a board from flowing into a light receiving portion and to keep out dust from the imaging device.

Another object of the invention is to provide an imaging device package, a camera module using the package and a camera using the module by implementing the reduction of thickness and adopting measures to keep out dust so as to secure mass producibility.

Still another object of the invention is to provide an imaging apparatus packaging structure capable of preventing the interference of some other signal line by setting the surrounding of a signal land to the ground level at the time of actually carrying out packaging to let a bare-chip packaging portion have a shield effect.

In order to accomplish the objects above, a small-sized module camera according to the invention comprises a lens mounted on the top surface side of a board and an imaging device mounted on the undersurface side of the board and used for receiving an image which is picked up through the lens, wherein a through-hole is provided in a ceramic board whereby to form an optical-system containing portion for containing an optical filter and the lens on the upper side of the through-hole and an imaging-device containing portion for containing the imaging device on the lower side of the through-hole; a support portion for supporting the optical filter between the optical-system containing portion and the imaging-device containing portion is provided so that the support portion is projected toward the imaging-device containing portion; the imaging device is contained in the imaging-device containing portion; the imaging device and the land portion of the ceramic board are mounted in a portion outside the support portion by flip-chip packaging; the vicinity of the flip-chip packaging portion is sealed up with resin and then the optical filter is mounted on the support portion; and the lens is inserted into the optical-system containing portion from above the optical filter.

The imaging device is contained in the imaging-device containing portion so that the undersurface of the imaging device is positioned inside the underside of the through-hole of the ceramic board; and solder lands are provided around the ceramic board.

The ceramic board has a layer capable of forming electrical passive elements inside.

A small-sized module camera according to the invention comprises a lens mounted on the top surface side of a board and an imaging device mounted on the undersurface side of the board and used for receiving an image which is picked up through the lens, wherein a through-hole is provided in a ceramic board whereby to make the through-hole an optical-system containing portion for containing an optical filter and the lens; a support portion for supporting the optical system is provided on the underside of the through-hole of the ceramic board so that the support portion is projected from the underside thereof; the imaging device is disposed on the underside of the through-hole of the ceramic board; the imaging device and the land portion of the ceramic board are mounted in a portion outside the support portion by flip-chip packaging; the vicinity of the flip-chip packaging portion is sealed up with resin and then the optical filter is mounted on the support portion; and the lens is inserted into the optical-system containing portion from above the optical filter.

An internal reflection preventive process is applied to the inner wall of the imaging-device containing portion.

Threads are respectively formed on the peripheral face of the lens and the inner wall of the imaging-device containing portion; and the lens is fitted to the optical-system containing portion by screwing the lens in.

A small-sized module camera according to the invention comprises a lens mounted on the top surface side of a board and an imaging device mounted on the undersurface side of the board and used for receiving an image which is picked up through the lens, wherein a through-hole is provided in a ceramic board; a positioning groove for supporting an optical filter is provided on the top surface side of the through-hole; a flowage preventive protrusion is provided on the underside of the through-hole; the imaging device and the land portion of the ceramic board are mounted in a portion outside the flowage preventive protrusion by flip-chip packaging; the vicinity of the flip-chip packaging portion is sealed up with resin and then the optical filter is mounted in the positioning groove; and a lens casing is fixed above the optical filter.

With the arrangement above, a sufficiently thinner camera module is secured and the assembling work is simplified and moreover the underfill material is prevented from flowing in by the support portion projected toward the imaging-device containing portion. In addition, dust can be kept out as the imaging device is sealed up by the optical filter.

Conventional small-sized module cameras have been incorporated into mobile telephone bodies by installing connector posts or incorporated into the bodies via flexible boards. As described in the claims however, it is unnecessary to prepare special connector posts or flexible boards, so that modules can be made smaller in size.

As resistors and capacitors are formable inside the ceramic board, the number of packaging parts is reducible.

By satinizing the inner wall of the ceramic board and employing black color for light leakage prevention, the effect of irregular reflection is preventable.

As the lens is so arranged as to be screwed into the ceramic board, the lens barrel and holder that have heretofore been necessitated can be dispensed with, so that by adjusting the pushing-in amount, the focus of the lens becomes adjustable.

The underfill material is prevented from flowing in by the support portion projected toward the imaging-device containing portion. Further, the optical filter can be installed in position and dust can also be kept out as the imaging device is sealed up.

In order to accomplish the objects above, a camera module according to the invention is so structured that an imaging device is mounted with an underfill material on one side of a board having a through-hole such that a light receiving portion faces the through-hole, wherein an underfill-material flowage preventive portion is provided so as to surround the through-hole on one side of the board; the underfill-material flowage preventive portion includes lands and resist layers formed on the respective lands; and with the underfill material filled in, the underfill-material flowage preventive portion blocks the underfill material from flowing into the light receiving portion.

Each land of the underfill-material flowage preventive portion is a conductive pattern and a silk screen printing layer is formed on the resist layer.

The underfill-material flowage preventive portion is built by repeatedly laminating the conductive pattern and the resist layer.

The board is formed of resin or ceramics and a resist material or a resin coating is provided on the wall of the through-hole of the board.

The board is formed of resin or ceramics and a resist material or a resin coating is provided on the outer peripheral side of the through-hole of the board.

A camera module producing method such that an imaging device is mounted on one side of a board having a through-hole so as to make a light receiving portion face the through-hole, comprising the steps of: positioning the imaging device so as to make the light receiving portion face the through-hole of the board and then mounting the imaging device on the pattern of the undersurface of the board by bare-chip packaging; preparing a jig having a bulkhead forming a hollow portion in the central portion, inserting the bulkhead into the through-hole of the board to contain the light receiving portion in the hollow portion of the bulkhead and putting the front end of the bulkhead on the imaging device; filling up the bare-chip packaging portion with an underfill material; and removing the jig.

In order to accomplish the objects above, an imaging device package according to the invention comprises a base mount having a through-hole, an imaging device with a light receiving portion mounted in a position opposite to the through-hole on one side of the mount, and a translucent plate so arranged as to cover the through-hole from the other side of the mount, wherein the light receiving portion is sealed up.

At least one or more than one solder land extending from one face up to the other is provided on the side of the mount.

An imaging device package according to the invention includes a groove extending from the one face up to the other and disposed on the side of the base mount and the solder lands disposed in the groove.

The base mount is formed of ceramics and passive elements such as resistors or capacitors are arranged in the ceramics.

A camera module having an imaging device package according to the invention comprises a board having a through-hole, the imaging device package so arranged that the translucent plate is disposed on one side of the board and contained in the through-hole and a lens is disposed on the other side of the board in such a manner as to cover the through-hole.

A camera according to the invention is equipped with the camera module above.

With the arrangement above, not only a small-sized and sealed-up imaging device package but also a mass-producible camera module with measures taken to deal with dust can be materialized.

In order to accomplish the objects above, an imaging device packaging structure according to the invention wherein the bare-chip board of a semiconductor element such as a CCD having lands of such as signal and power supply lines is mounted on a mother board by flip-chip packaging, comprises GND lands for surrounding lands of such as signal and power supply lines of the bare-chip board of the semiconductor element, which GND lands are situated around the respective lands of the bare-chip board thereof, GND lands for surrounding lands of such as signal and power supply lines are disposed in positions corresponding to the lands of the bare-chip board of the semiconductor element, which GND land are situated around the respective lands of the mother board, a conductive sheet film having conductive particles which stick to the gap between the lands when pressurized and heated to cause the lands to conduct, and a solid GND land layer is formed by connecting the mother board and the bare-chip board of the semiconductor element by the flip-chip packaging with the conductive sheet film, wherein the lands of the signal and power supply lines are tightly sealed up by the solid GND land layer and electrically shielded.

The imaging device packaging structure is such that the GND lands for surrounding the respective signal and power supply lines are formed integrally into one conductive pattern.

The imaging device packaging structure is such that the mother board is a multilayer board or a flexible board.

With the arrangement above, as the flip-chip packaging portion of each land of the bare-chip board of the semiconductor element is surrounded with the solid GND land layer, the level of the feeble signals exchanged between the bare-chip board of the semiconductor element and the mother board is stabilized and the S/N ratio is improved.

BRIEF DESCRIPTION OF THE DRAWINGS

FIG. 11 is a process drawing illustrating a camera module producing method embodying the invention.

FIG. 15A is a sectional view; and FIG. 15B, an exploded perspective view.

FIG. 22 is a flowchart showing the steps of mounting the imaging apparatus according to the invention.

DETAILED DESCRIPTION OF THE PREFERRED EMBODIMENTS

A detailed description will now be given of embodiments of the invention by reference to the drawings.

First Embodiment

Figure 1:
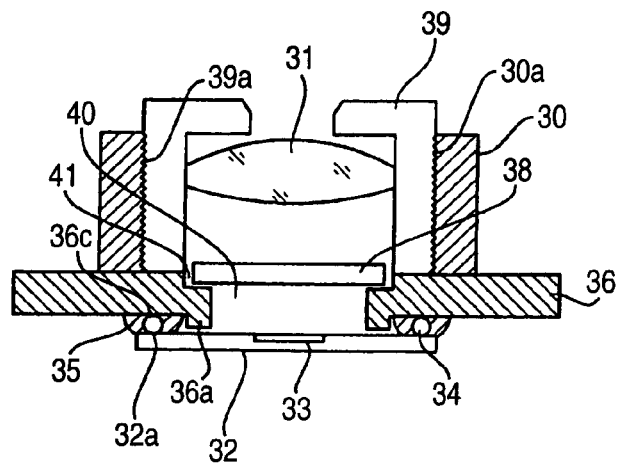
FIG. 1 is a block diagram showing a small-sized module camera as a first embodiment of the invention.

FIG. 1 is a block diagram showing a small-sized module camera as a first embodiment of the invention.

As shown in FIG. 1, an optical system is disposed on the top surface of a ceramic board and an imaging device is arranged on the undersurface thereof, for example, according to this embodiment of the invention.

Incidentally, HTCC (High Temperature Cofired Ceramics) or LTCC (Low Temperature Cofired Ceramics) is used for the ceramic board. HTCC is high temperature cofired ceramics and features a high dielectric coefficient. HTCC is inferior in working precision to the LTCC but less costly. LTCC is low temperature cofired ceramics and features low resistance and non-contractibility. LTCC is excellent in working precision and lower in dielectric coefficient than the HTCC (and is fit for a high-frequency circuit).

The LTCC OR HTCC (hereinafter called "LTCC", to collectively represent both of them) 36 is employed for the board and black is adopted as a shielding color.

The LTCC 36 has a. C and an R layer inside and electrically passive elements including capacitors and resistors, for example, are formable in these layers.

A through-hole is provided in the LTCC 36 and a positioning groove 41 is provided in the boundary portion of the through-hole 40 on the top surface side of the LTCC 36. On the other hand, a bulkhead-like flowage preventive protrusion 36a is formed so as to surround the boundary portion of the through-hole 40 on the undersurface side of the LTCC 36.

A gold-plated portion (including a bump 34) 32a is provided in the peripheral portion of the imaging device 32 and a gold-plated portion 36c is also provided on the outer side of the flowage preventive protrusion 36a, on the undersurface side of the LTCC 36. Flip-chip packaging is carried out by putting the gold-plated portion 32a of the imaging device 32 on top of the gold-plated portion 36c of the LTCC 36.

After the flip-chip packaging, an underfill material 35 is used to seal up the joint with resin. As the underfill material 35 is blocked by the flowage preventive protrusion 36a, the underfill material 35 is not allowed to flow toward the light receiving portion 33 of the imaging device 32.

A lens 31 is incorporated in a lens barrel 39 and the outer periphery of the lens barrel 39 is provided with a thread portion 39a. On the other hand, a thread portion 30a is provided on the inner wall of a lens holder 30. The lens holder 30 is fixed onto the surface of the LTCC 36 with an adhesive.

An IR cut-filter 38 is fitted into the positioning groove 41 before being placed in position and then the lens barrel 39 is screwed into the lens holder 30 so as to be mounted therein. According to this embodiment of the invention, the underfill material 35 is prevented from flowing in and the light receiving portion of the imaging device is tightly scaled up with the IR cut-filter, whereby dust and the like can also be kept out.

Second Embodiment

Figure 2:
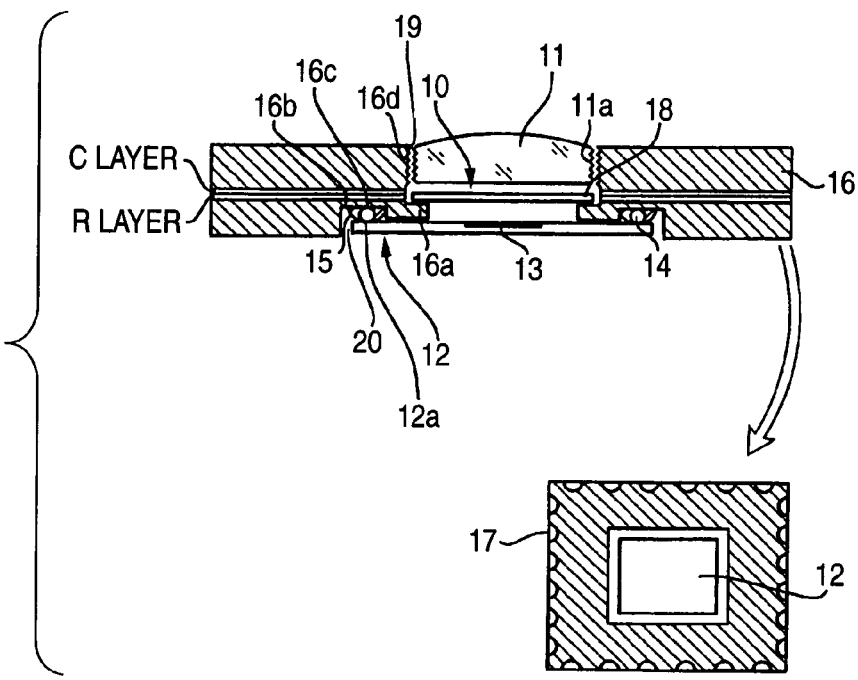
FIG. 2 is a block diagram showing a small-sized module camera as a second embodiment of the invention.

FIG. 2 is a block diagram showing a small-sized module camera as a second embodiment of the invention.

As shown in FIG. 2, an optical system and an imaging device are contained within a through-hole formed in a ceramic board, for example, according to this embodiment of the invention.

The LTCC or HTCC (hereinafter called the "LTCC" collectively representing both of them) 16 is employed for the board and black is adopted as a shielding color.

The LTCC 16 has a C and an R layer inside and electrically passive elements including capacitors and resistors, for example, are formable in these layers.

A through-hole 10 is provided in the LTCC 16 and the upper side of the through-hole 10 is in the form of a columnar hole, whereas the lower side thereof is in the form of a quadrangular hole. The columnar hole is equivalent to an optical-system containing portion 19 for containing an IR cut-filter 18 and a lens 11, and the quadrangular hole to an imaging-device containing portion 20 for containing an imaging device 12 having a light receiving portion 13. A thread portion 16d is formed on the inner wall of the optical-system containing portion 19. A support portion 16a for supporting the IR cut-filter 18 and preventing an underfill material 15 from flowing into the light receiving portion 13 of the imaging device 12 is formed in the boundary portion between the optical-system containing portion 19 and the imaging-device containing portion 20. The support portion 16a is projected from the base 16b of the imaging-device containing portion 20 and in the form of a bulkhead surrounding the optical-system containing portion 19.

A gold-plated portion (including a bump 14) 12a is provided in the peripheral portion of the imaging device 12 and a gold-plated portion 16c is also provided on the outside of the bulkhead of the base 16b of the imaging-device containing portion 20.

Flip-chip packaging is carried out by putting the gold-plated portion 12a of the imaging device 12 on top of the gold-plated portion 16c of the imaging-device containing portion 20.

The back of the imaging device 12 subjected to the flip-chip packaging is positioned inside the undersurface of the LTCC and the whole imaging device 12 is contained in the imaging-device containing portion 20. After the flip-chip packaging, the underfill material 15 is used to seal up the joint with resin. As the underfill material 15 is blocked by the support portion 16a, the underfill material 25 is not allowed is to flow toward the light receiving portion 13 of the imaging device 12.

On the side of the optical-system containing portion 19, the IR cut-filter 18 is mounted on the support portion 16a so as to be placed in position and then the lens 11 provided with a thread portion 11a on the periphery is screwed into the optical-system containing portion 19 with the thread portion 16d on the inner wall, so that the lens 11 can be mounted in the optical-system containing portion 19. By adjusting the pushing-in amount, the focus of the lens can be adjusted. The surface of the light receiving portion 13 of the imaging device 12 is made free from dust and the like because the light receiving portion 13 is tightly sealed up with the IR cut-filter 18.

Lands 17 are provided on the periphery of the back of LTCC 16. Consequently, it is possible to mount a module including the lens directly in a mobile telephone body without using a connector post and a flexible board.

Since the IR cut-filter 18 is contained in the LTCC 16 with the lens 11 screwed into the LTCC 16, parts such as a holder can be dispensed with, so that the number of parts are reducible and as the imaging device is contained on the lower side of the hole within the LTCC 16, an extremely thin, small-sized camera module is attainable.

Third Embodiment

Figure 3:
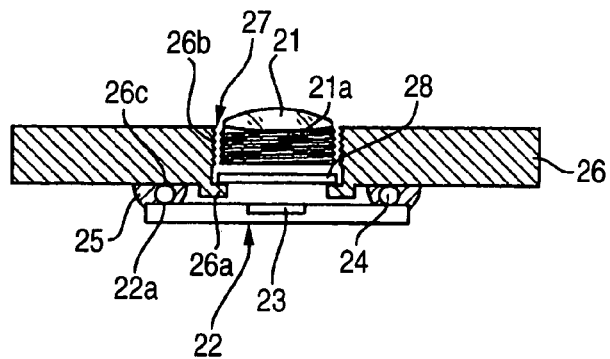
FIG. 3 is a block diagram showing a small-sized module camera as a third embodiment of the invention.

FIG. 3 is a block diagram showing a small-sized module camera as a third embodiment of the invention.

As shown in FIG. 3, an optical system is contained in a ceramic board and an imaging device is provided on the undersurface of the ceramic board, for example, according to this embodiment of the invention.

LTCC 26 is used for the board as shown in FIG. 2.

A columnar through-hole is provided in the LTCC 26 and this through-hole is equivalent to an optical-system containing portion 27 for containing an IR cut-filter 28 and a lens 21. A thread portion 26b is formed on the inner wall of the optical-system containing portion 27. A support portion 26a for supporting the IR cut-filter 28 and preventing an underfill material 25 from flowing into the light receiving portion 23 of an imaging device 22 is formed in the boundary portion of optical-system containing portion 27 on the undersurface of the LTCC 26. The support portion 26a is projected from the undersurface of the LTCC 26 in the form of a bulkhead surrounding the optical-system containing portion 27.

A gold-plated portion (including a bump 24) 22a is provided in the peripheral portion of the imaging device 22 and a gold-plated portion 26c is also provided on the outside of the bulkhead of the undersurface of the LTCC 26. Flip-chip packaging is carried out by putting the gold-plated portion 22a of the imaging device 22 on top of the gold-plated portion 26c of the LTCC 26.

After the flip-chip packaging, the underfill material 25 is used to seal up the joint with resin. As the underfill material 25 is blocked by the support portion 26a, the underfill material 25 is not allowed to flow toward the light receiving portion 23 of the imaging device 22.

In the optical-system containing portion 27, the IR cut-filter 28 is mounted on the support portion 26a so as to be placed in position and then the lens 21 provided with a thread portion 21a on the periphery is screwed into the optical-system containing portion 27 with the thread portion 26d on the inner wall, so that the lens 21 can be mounted in the optical-system containing portion 27. By adjusting the pushing-in amount as in the embodiment of the invention in FIG. 1 likewise, the focus of the lens can be adjusted. The surface of the light receiving portion 23 of the imaging device 22 is set free from dust and contaminents because the light receiving portion 23 is tightly sealed up with the IR cut-filter 28. Since the IR cut-filter 28 is contained in the LTCC 26 with the lens 21 screwed into the LTCC 26, parts such as a holder can be dispensed with, so that the number of parts is reducible and as the imaging device is contained on the lower side of the hole within the LTCC 26, an extremely thin, small-sized camera module is attainable.

As the through-hole provided in the board is employed as the optical-system containing portion in the camera modules of FIGS. 2 and 3, these camera modules can be made thinner than the camera module of FIG. 1 using the lens barrel.

Figure 4:
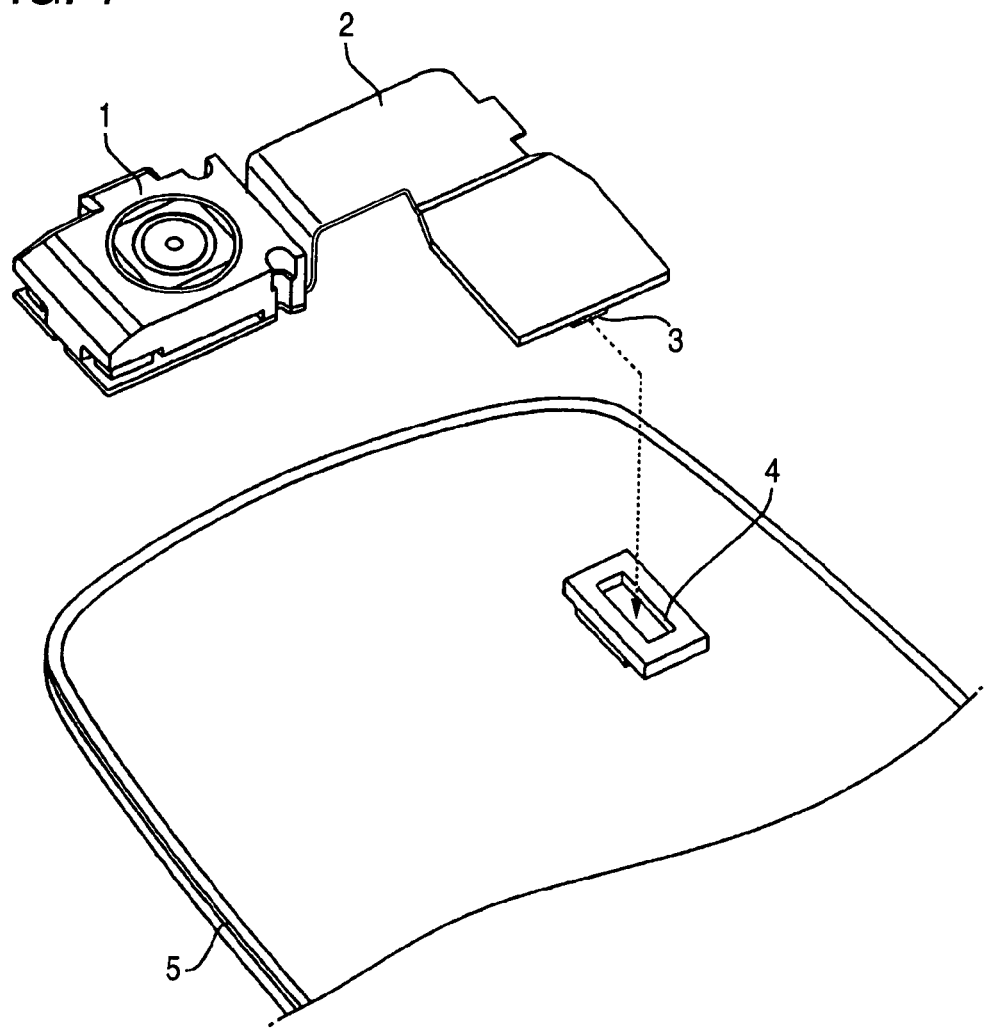
FIG. 4 is a diagram showing the inside of a mobile telephone body wherein the small-sized module camera according to the invention is assembled.

FIG. 4 is a diagram showing the inside of a mobile telephone body wherein a small-sized module camera according to the invention is assembled.

A female connector 4 is installed in the board packaging portion of the body of a mobile telephone 5. A camera portion 1 with the assembled camera module according to the invention is connected to a flexible board 2. A male connector 3 is fitted to the front end portion of the flexible board 2.

The male connector 3 is electrically connected to the female connector 4 by fitting the former into the latter and both of the connectors can be incorporated into the mobile telephone.

This example is what has been applied to the second or third embodiments of the invention.

Although explanation has been made of those for use in mobile telephones as applicable examples, the camera modules described herein are applicable to a PHS and a PDA and also usable for digital and on-board cameras.

As the camera module is arranged as set forth above, the invention has the following effect.

1) The underfill material can be prevented from flowing into the light receiving portion by providing the protruded portion on the imaging device side of the ceramic board. Moreover, manufacturing efficiency can be raised by providing the positioning groove for use in fitting the optical filter into the ceramic board so as to simplify the positioning work with the effect of keeping out dust by sealing up the light receiving portion with the optical filter.

2) It has been arranged that the imaging device is contained within the through-hole, whereupon the thickness of the camera module is reduced further. As the lens barrel and the lens holder are made unnecessary, the number of parts is reduced and the steps of attaching a FPC and the lens holder can also be omitted. Moreover, the focus of the lens is set adjustable by varying the degree of screwing the lens in.

In this case, the inner wall of the ceramic board is satinized and simultaneously the board itself is colored black in order to prevent light leakage whereby to avert the effect of irregular reflection of the light introduced.

3) As resistors and capacitors are formed in a stratified condition on the ceramic board, the number of parts is reduced. With respect to an area in which the imaging device of the ceramic board is mounted by the flip-chip packaging, the imaging device is so structured that it is completely contained within the ceramic board and by providing the lands on the ceramic board such that the module itself including the lens can directly be mounted, whereby the necessity of specifically preparing the connector post and the flexible board is obviated with the effect of decreasing the size of the whole module body.

Fourth Embodiment

Figure 5:
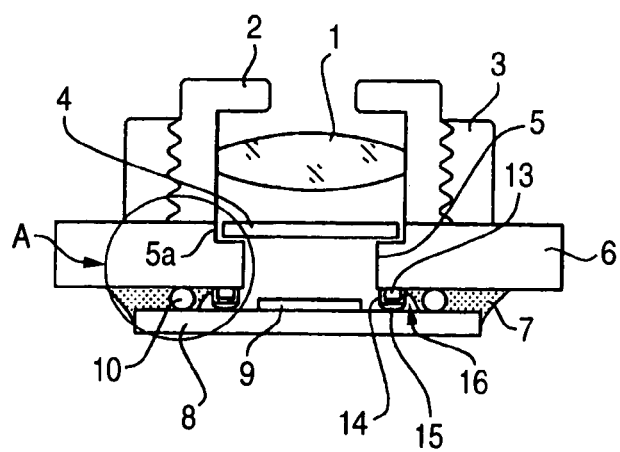
FIG. 5 is a sectional view of a camera module as a fourth embodiment of the invention.
Figure 6A:
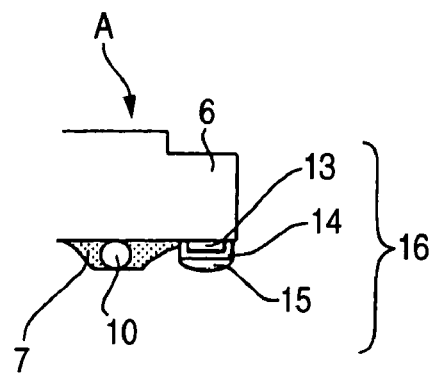
FIGS. 6A-6C are diagrams illustrating the underfill-material flowage preventive portion of FIG. 5 in detail.
Figure 6B:
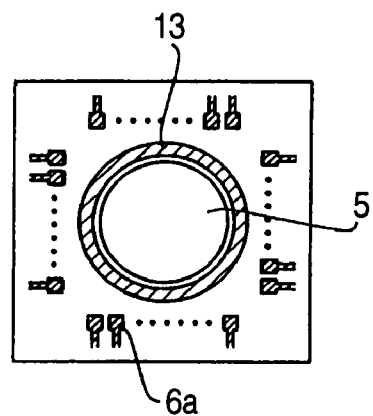
Figure 6C:
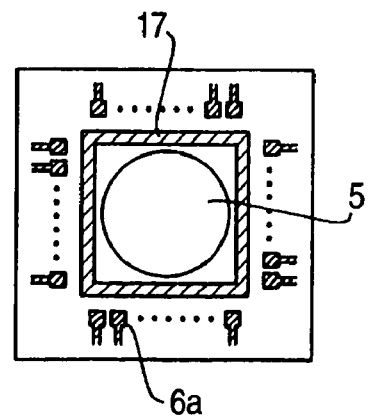

FIG. 5 is a sectional view of a camera module as a fourth embodiment of the invention and FIGS. 6A to 6C show diagrams illustrating the underfill-material flowage preventive portion of FIG. 5 in detail.

A plastic or a ceramic board is employed as a board 6.

A through-hole 5 is provided in the board 6 and a stepped portion 5a is provided in the upper portion of the through-hole 5. A land 13 having a copper pattern as the base of an underfill-material flowage preventive portion 16 is formed like a ring around the through-hole 5 in the undersurface of the board 6. Moreover, many gold-plated solder lands 6a for the bare-chip packaging of an imaging device 8 are formed around the land 13.

A resist layer 14 is applied onto the ring-like land 13 and a silk screen printing layer 15 is formed on the resist layer 14 (as shown in FIG. 6A in detail).

The underfill-material flowage preventive portion 16 comprises the land 13, the resist layer 14 and the silk screen printing layer 15. The underfill-material flowage preventive portion 16 is set as thick as the front end portion of the silk screen printing layer 15 makes contact with the surface of the imaging device 8. Even though there is a small gap between the silk screen printing layer 15 and the imaging device 8, an underfill material 7 is prevented from flowing in because of surface tension. The actual thickness of the underfill-material flowage preventive portion 16 roughly ranges from 50 μm to 80 μm in total, for example; the thickness may be 50 μm or smaller or 80 μm or greater and the adjustment of the total thickness is controlled by the thickness of the land 13. The thickness of the resist layer 14 roughly ranges from 20 μm to 30 μm and the thickness of the silk screen printing layer from 20 μm to 30 μm.

The thickness of the bump subjected to the flip-chip packaging is approximately 50 μm. Even though the thickness of the bump subjected to the flip-chip packaging comes to 50 μm or either smaller or greater, the underfill material is prevented from flowing in by making the thickness of the underfill-material flowage preventive portion 16 properly smaller than that of the bump. The underfill-material flowage preventive portion may be formed by making a land 17 a quadrilateral so as to surround the through-hole as shown in FIG. 6C.

The configuration of surrounding the through-hole 5 may be polygonal or in any other form corresponding to a closed curve other than a ring.

The underfill-material flowage preventive portion 16 may be made simultaneously with the formation of the pattern of the board 6 and because no protruded portion is formed on the board itself, the work during the manufacturing process is simplified, which results in lowering the production cost.

After the board 6 is thus constructed, the light receiving portion 9 of the imaging device 8 is positioned over the undersurface of the board 6 so that the light receiving portion 9 faces the through-hole 5 and the imaging device 8 is bonded by the flip-chip packaging to the gold-plated solder lands 6a via the bump 10. With the flip-chip packaging, the silk screen printing layer 15 of the underfill-material flowage preventive portion 16 is brought into contact with the top surface of the imaging device 8 whereby to surround the light receiving portion 9.

At the step of coating the underfill material 7 applied to the flip-chip packaging portion thereafter, the underfill material 7 is locked by the underfill-material flowage preventive portion 16 even when the underfill material 7 attempts to flow toward the center of imaging device 8 and never adversely affects the light receiving portion 9.

Then an IR cut-filter 4 is mounted on the stepped portion 5a and a lens holder 3 is fixed onto the top surface of the board 6 and further a lens barrel 2 for holding a lens 1 is screwed and fitted into the lens holder 3 with a thread portion formed on the inner peripheral face.

Figure 7A:
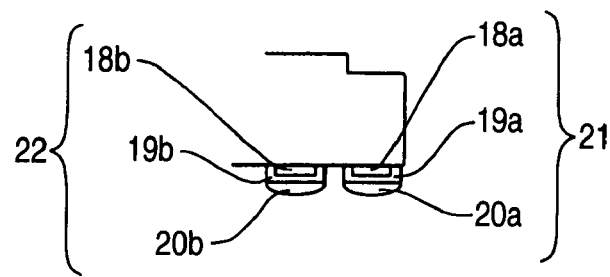
FIGS. 7A-7C are diagrams illustrating another underfill-material flowage preventive portion embodying the invention.
Figure 7B:
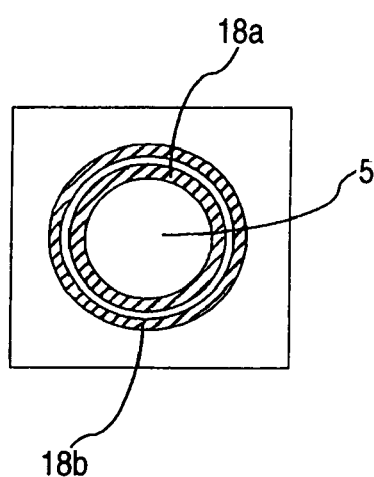
Figure 7C:
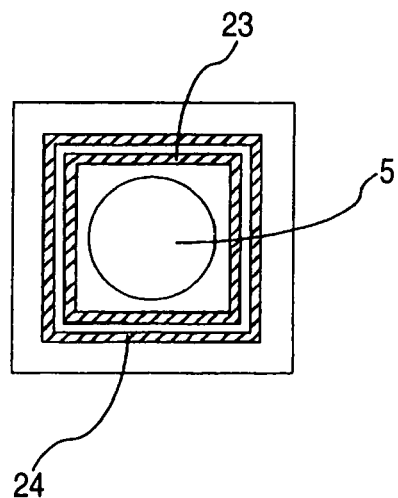

FIGS. 7A to 7C show diagrams illustrating another underfill-material flowage preventive portion embodying the invention.

According to this embodiment of the invention, an underfill-material flowage preventive portion 22 is provided on the outer side of another underfill-material flowage preventive portion 21 so as to surround the through-hole 5 double. The underfill-material flowage preventive portion 21 comprises a land 18a, a resist layer 19a and a silk screen printing layer 20a, whereas the underfill-material flowage preventive portion 22 comprises a land 18b, a resist layer 19b and a silk screen printing layer 20b. As shown in FIG. 7B, the lands 18a and 18b are formed like a double ring. As shown in FIG. 7C, moreover, the lands may be formed into a quadrilateral or can be in any other shape capable of surrounding the through-hole 5.

Although each of the underfill-material flowage preventive portions 16 (FIG. 6A), 21 and 22 is shown such that it comprises the land, the resist layer and the silk screen printing layer by way of example, such an underfill-material flowage preventive portion may be arranged as follows:

The underfill-material flowage preventive portion is formed by laminating a copper pattern, a resist layer, a copper pattern . . . a silk screen printing layer in this order; otherwise, a copper pattern, a resist layer . . . a copper pattern and a resist layer may be laminated in this order without applying silk screen printing layer to the uppermost face when a multilayer board is employed.

Figure 8:
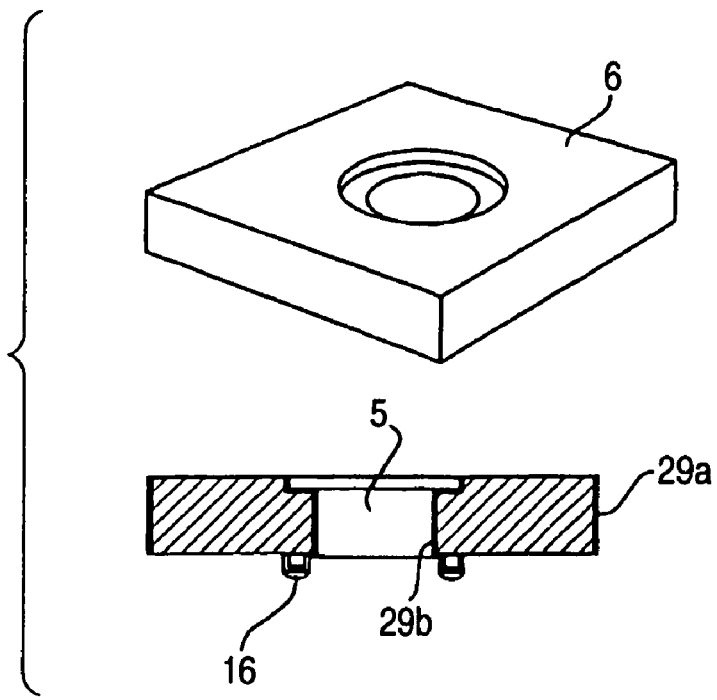
FIG. 8 is a diagram illustrating the processing of the board portion of the camera module according to the invention.

FIG. 8 is a diagram illustrating the processing of the board portion of the camera module according to the invention. FIG. 8 shows not only the underfill-material flowage preventive portion on the board but also only the vicinity of a resin coating.

The underfill material is prevented by the underfill-material flowage preventive portion 16 from flowing into the light receiving portion so as to seal the light receiving portion in the through-hole 5. Moreover, a resin coating 29b is applied to the inner wall of the through-hole 5 of the board whereby to keep out dust from the inside of the through-hole even after the light receiving portion is sealed up. Further, a resin coating 29a is also applied to the outer peripheral side of the board 6. Thus dust is suppressed by the resin coatings 29a and 29b to fall from the wall of the through-hole 5 and the outer peripheral side of the board 6. The resin coating 29b on the through-hole 5 prevents the light introduced by the lens from producing flare as the light strikes against the inner wall of the through-hole 5. The same effect is achievable by using resist material instead of the resin coating.

The application of the resin coating is especially effective for the resin-molded board 6 and in suppressing dust generation likewise even in the case of a ceramic board whose through-hole inside and whose outer periphery have a sandy surface.

Figure 9:
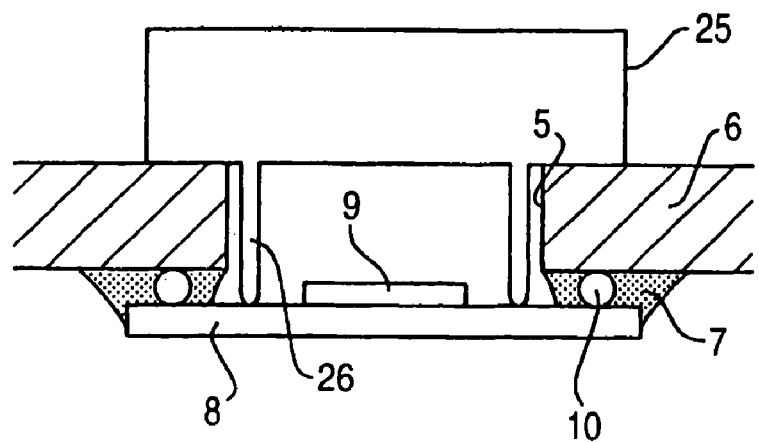
FIG. 9 is a sectional view illustrating a jig for preventing the flow of an underfill material embodying the invention.

FIG. 9 is a sectional view illustrating a jig for preventing the flow of an underfill material embodying the invention and FIG. 10 shows diagrams illustrating the configurations of the front end portions of the flowage preventive portion of FIG. 9 by way of example.

According to this embodiment of the invention, an underfill-material flowage preventive portion is not provided with a pattern layer on the board 6 but the underfill material 7 is prevented from flowing in by a jig 25 made of resin.

A cylindrical flowage preventive portion 26 is provided on the undersurface of the jig 25. The cylindrical form of the flowage preventive portion 26 surrounds the light receiving portion 9 and there is secured a depth for the flowage preventive portion 26 so that its base is not brought into contact with the surface of the light receiving portion 9.

Figure 10A:
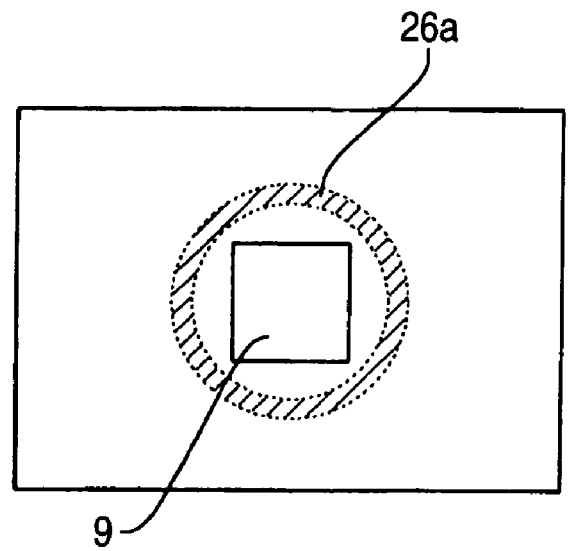
FIGS. 10A and 10B are diagrams illustrating the configurations oft the front end portions of the flowage preventive portion of FIG. 9 by way of example.

FIG. 10A shows the front end configuration 26a of the flowage preventive portion 26 at the time the jig 25 is inserted into the through-hole 5. The underfill material 7 is filled in with the periphery of the light receiving portion 9 of the imaging device 8 enclosed.

Figure 10B:
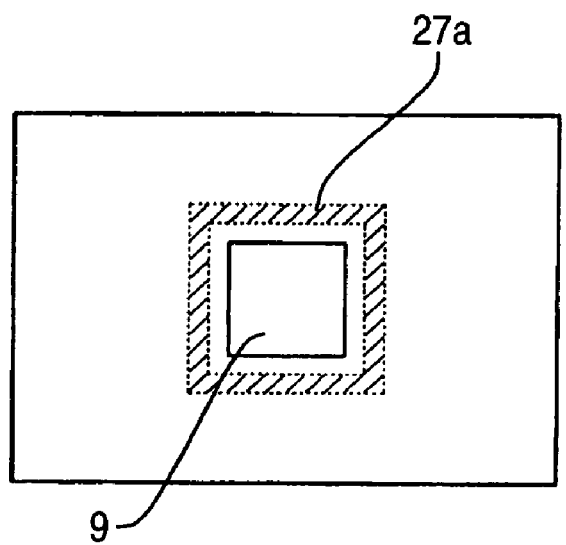

The flowage preventive portion is not cylindrical but may be polygonal in a cylindrical form. FIG. 10B shows a quadrilateral cylindrical front end configuration 27a. The flowage preventive portion can also be elliptical in a cylindrical form or in any other cylindrical form.

FIG. 11 is a process drawing illustrating a camera module producing method embodying the invention.

First, the imaging device 8 is mounted via the bump 10 on the undersurface side of the board 6 so that the light receiving element 9 faces the through-hole 5 (Step 001 (hereinafter called S001)).

The flowage preventive portion 26 of the jig 25 is inserted into the through-hole 5 and its front end portion is brought into contact with the surface of the imaging device 8 (S002). The light receiving element 9 is contained in the flowage preventive portion 26. In this condition, the underfill material 7 is applied (S003).

After the underfill material 7 is applied, the mounting of the imaging device 8 onto the board 6 is completed when the jig 25 is removed from the board 6 (S004) and then the step of mounting the lens is followed.

This method of omitting the provision of the lands for preventing the underfill material from flowing in on the undersurface of the board 6 makes it possible to prevent the underfill material from flowing in and is less costly without providing the lands in case that the undersurface of the board is crowded with other circuit patterns, thus making it difficult to build lands for underfill prevention.

As set forth above, a camera module having the underfill-material flowage preventive portion that is structurally inexpensive can be materialized according to the invention.

When the resin-molded board or the ceramic board (whose hole has a sandy wall surface) is employed, dust generation from the wall of the through-hole and outer peripheral side of the board can be suppressed. Further, it is possible to realize a method of producing a camera module including preventing the underfill material from flowing in by means of a simple jig.

Fifth Embodiment

Figure 12A:
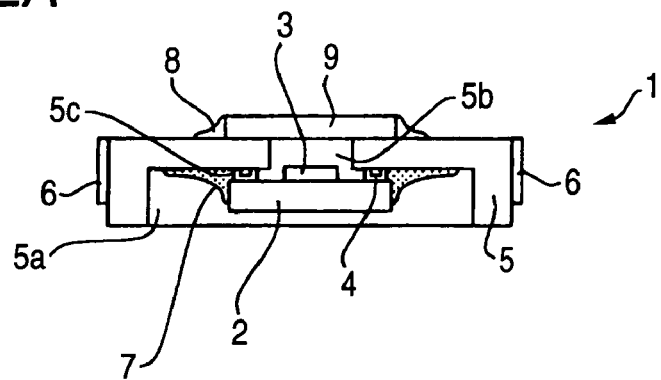
FIG. 12A is a sectional view of the imaging device package of the invention.
Figure 12B:
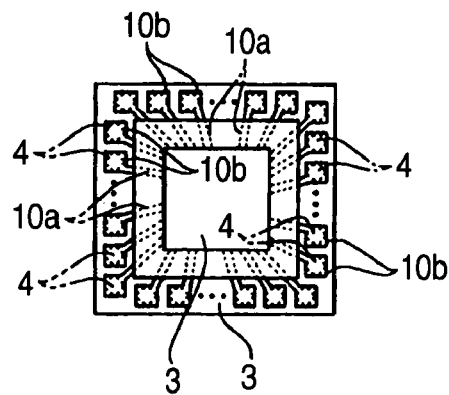
FIG. 12B is a plan view of an imaging device of FIG. 12A.
Figure 12C:
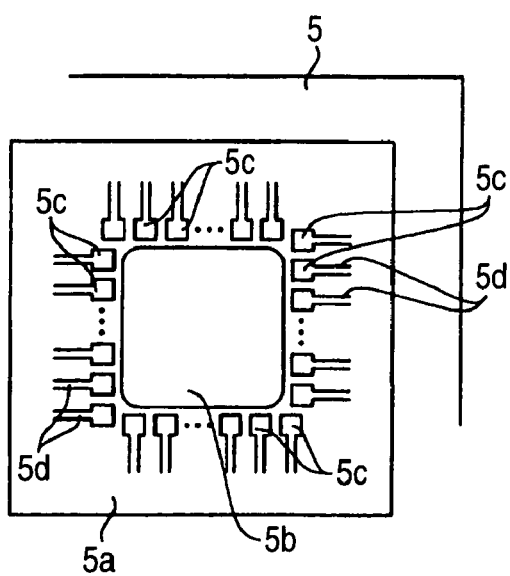
FIG. 12C is a bottom view of a ceramic package of FIG. 12A.

FIGS. 12A-12C show an imaging device package embodying the invention: FIG. 12A is a sectional view of the imaging device package; FIG. 12B, a plan view of an imaging device; and FIG. 12C, a bottom view of a ceramic package.

A ceramic package is used as a package mount. The ceramic package 5 has an imaging-device containing portion 5a and a through-hole 5b is provided in the center thereof. Many solder lands 6 extended from the center of the side up to the top surface of the ceramic package 5 are provided on the side of the ceramic package 5.

A light receiving portion 3 is disposed in the central portion of an imaging device (bare chip) 2 and a land 10b is formed in the front end portion of each pattern 10a connected to the light receiving portion 3 and drawn out therefrom. A gold bump 4 is mounted on each land 10b.

On the other hand, a land 5c is provided in a position corresponding to each land 10b of the imaging device 2 on the base of the imaging-device containing portion 5a. Patterns 5d provided in a connected row arrangement are connected to the respective solder lands 6 provided on the side of the ceramic package 5.

In order to mount the imaging device 2 on the base of the imaging-device containing portion 5a of the ceramic package 5, each land 10b of the imaging device 2 is positioned so as to be located on each corresponding land 5c of the ceramic package and then the gold bump 4 is melted. The imaging device 2 with the patterns electrically connected is fixed to the ceramic package 5. By filling the land portion with the underfill agent (or any other sealing agent) 7 thereafter, the gap between the imaging device 2 and the lower edge face of the through-hole 5b is tightly sealed up.

Sheet glass 9 is mounted over the through-hole 5b of the ceramic package 5 after the imaging device 5 is mounted. Then the gap between the sheet glass 9 and the upper edge face of the through-hole 5b is tightly sealed up with a sealing agent 8, so that the through-hole 5b for containing the light receiving portion 3 can completely be sealed up. As it is needed for the through-hole 5b to contain only the light receiving portion 3, the through-hole is dimensionally reduced. The size of the sheet glass can also be made smaller than what is in the conventional imaging device package, whereby cost reduction becomes feasible.

Sixth Embodiment

Figure 13A:
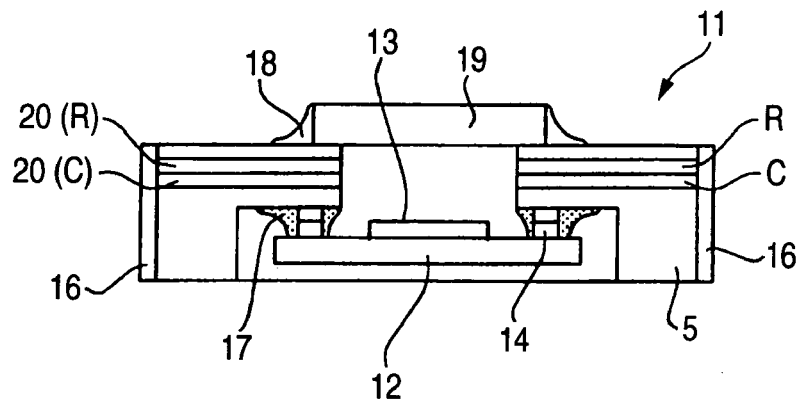
FIG. 13A is a sectional view of another embodiment of the invention.

FIG. 13A is a sectional view of another embodiment of the invention.

This embodiment of the invention is different from what is described in FIG. 12 in the inner structure and the configuration of the solder land on the side of the ceramic package, the rest of the arrangement being essentially similar.

Resistors 20 and capacitors 21 are formed within a ceramic package 15 and places where these passive elements are installed can be set within the ceramic package, so that the packaging density of the elements can be improved.

Solder lands 16 in a rectangular form are provided on the side of the ceramic package 15 and extended from the top surface up to the undersurface of the ceramic package 15.

Due to the shape of each solder land 16, an imaging device package II can be mounted on either top surface or undersurface of a board for use in forming a camera module as will be described later.

Figure 13B:
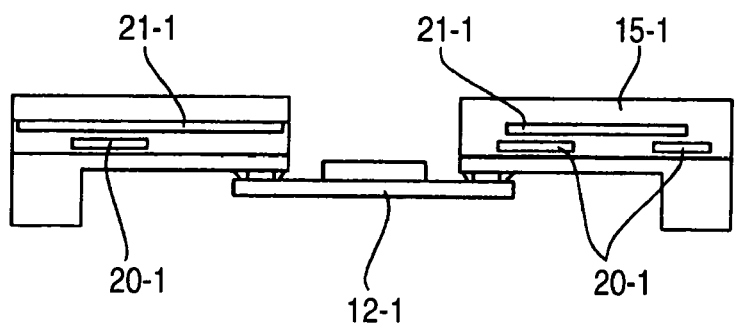
FIG. 13B is a sectional view of still another embodiment of the invention showing a ceramic multilayer board with an imaging device mounted by bare-chip packaging.

FIG. 13B is a sectional view of still another embodiment of the invention showing a ceramic multilayer board with an imaging device mounted by bare-chip packaging.

The illustration of sheet glass and solder lands is omitted as shown in FIG. 13B and LTCC or HTCC is used for a multilayer ceramic board. The example of FIG. 13B is different from what is shown in FIG. 13A in the arrangement of passive elements formed within the multilayer ceramic board, the rest being essentially similar.

A capacitor 21-1 is formed in a layer close to the top surface of the multilayer ceramic board 15-1 and a resistor is formed in a layer beneath the layer of the capacitor.

Figure 14:
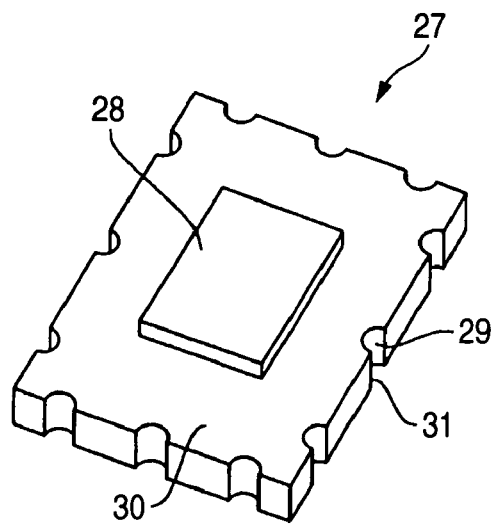
FIG. 14 is a perspective view showing the external appearance of an imaging device package according to the invention.

FIG. 14 is a perspective view showing the external appearance of an imaging device package according to the invention.

Sheet glass 28 is mounted in the center of the top surface of a ceramic package 30. Three solder lands 29 are provided on each side of the ceramic package 30. Each solder land 29 is formed within a slot 31 provided from the top surface up to the undersurface of the ceramic package 30.

Figure 15A:
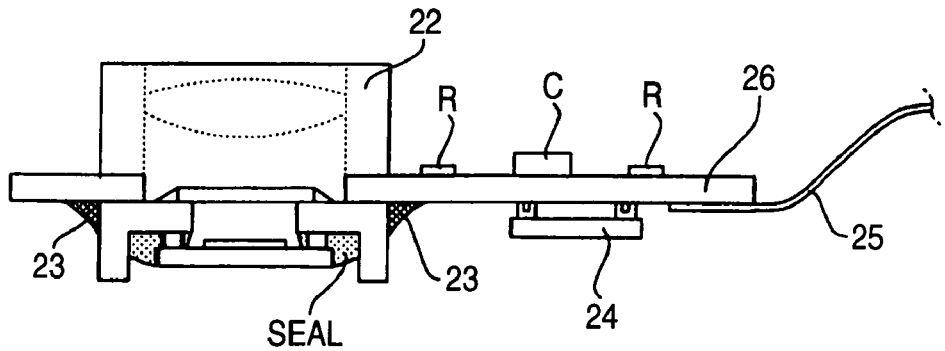
FIGS. 15A and 15B are diagrams showing a camera module using an imaging device package embodying the invention.
Figure 15B:
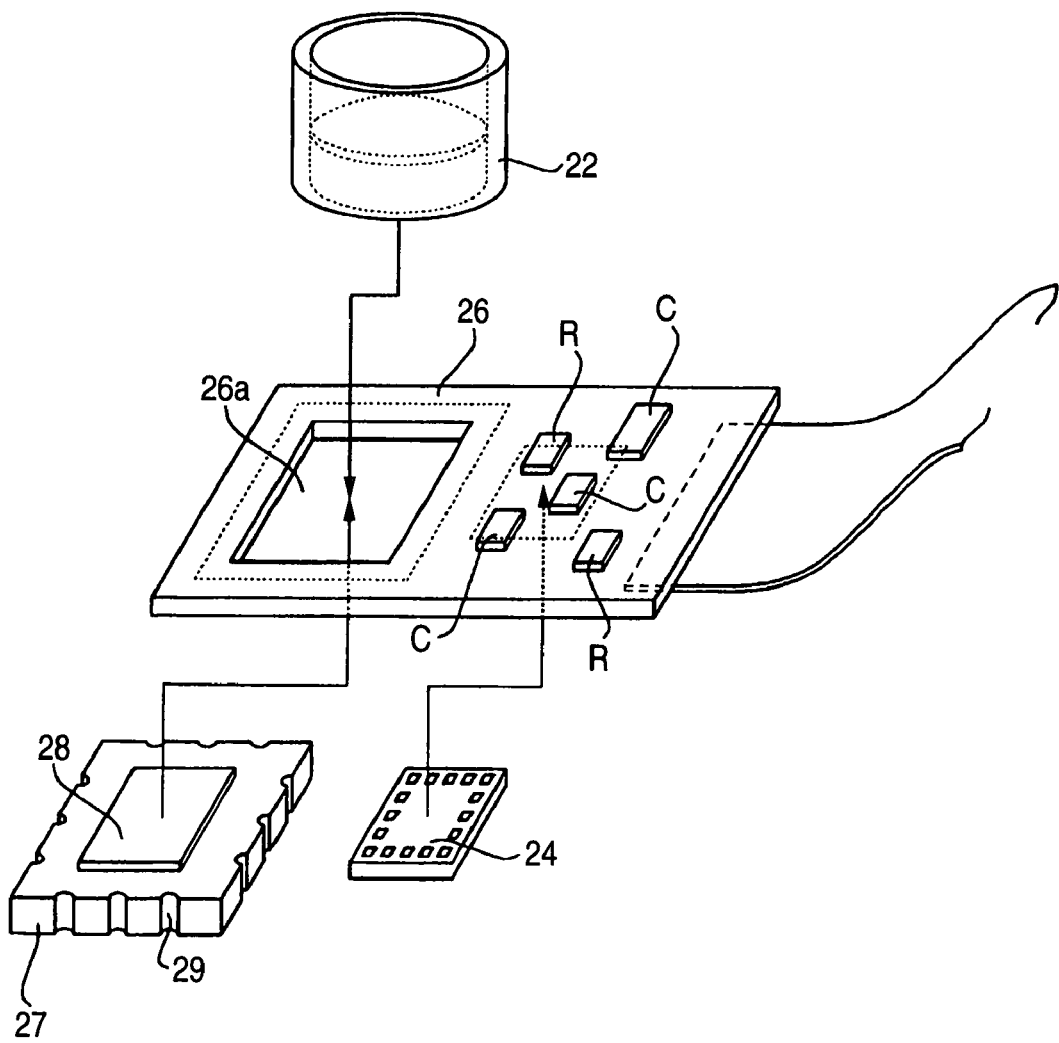

FIGS. 15A and 15B are diagrams showing a camera module using an imaging device package embodying the invention: FIG. 15A is a sectional view; and FIG. 15B, an exploded perspective view.

Resistors R and a capacitor C are mounted on the right-hand top surface of a ceramic board 26, whereas DSP (IC) 24 is mounted on the left-hand undersurface thereof. A through-hole 26a is provided in a leftish position from the center of the ceramic board 26.

An imaging device package 27 is disposed on the undersurface of the board 26 so that sheet glass 28 is accommodated within the through-hole 26a and pattern lands (not shown) and solder lands 29 are soldered to the undersurface of the board 26. A lens portion 22 is mounted on the top surface of the ceramic board 26 so as to cover the through-hole 26a, whereby a camera module is formed.

As the imaging device package 27 is sealed up, dust is kept out from the imaging device when the board 26 is mounted; hence, mass-producibility can be secured while it is feasible to reduce the size on the whole.

A camera using the camera module of FIG. 15 will now be described.

The camera module above can be incorporated into any one of cameras including a digital camera, an on-board camera, a camera for computer, a supervisory camera and an interphone camera.

When the camera module is incorporated into a digital camera, the lens portion of the camera module is fitted to the front of a camera body as a lens position and a flexible board electrically connected to a board mounted with the lens portion is connected to a control circuit board mounted with an image-processing control circuit. An object image focused in an imaging device package through the lens portion is converted into electricity and processed as prescribed before being sent to the control circuit. The transmitted image data is temporarily stored in the control circuit and converted into a predetermined form and displayed in a liquid crystal display portion. Subsequently, the process of taking in the object image simultaneously with shutter release and storing the image in a memory is performed. As set forth above, the imaging device package is reduced in size by mounting the imaging device directly on a package mount by flip-chip (FC) packaging. The whole package can be reduced in size to an extent of conventionally carrying out wire bonding (W/B).

A cover glass is placed on the top surface and the imaging device is placed on the undersurface opposite to the cover glass with the through-hole held there between, whereby the imaging device package can be handled as a single part with measures taken to deal with dust, so that it becomes unnecessary to adopt measures to keep out dust during the process of manufacturing camera modules.

The mounting of the imaging device package is made possible by the board-boring method as the solder lands of the imaging device package are mountable after being electrically connected even in case that the patterns exist on either top surface or undersurface of the board. Therefore, the dimension of the camera module in its height direction with the lens mounted can be reduced and consequently the whole camera module is actually reduced in size.

The camera module according to the invention is suitably usable, for portable communication apparatus such as a mobile telephone and information terminal equipment such as a PDA. Moreover, the camera module according to the invention is usable for a digital camera, an on-board camera, a board camera for computer, a supervisory camera, an interphone camera and so forth.

As an attempt to make the imaging device package smaller is viable according to the invention, it is realizable to make a camera module and a camera smaller as well.

Seventh Embodiment

Figure 16:
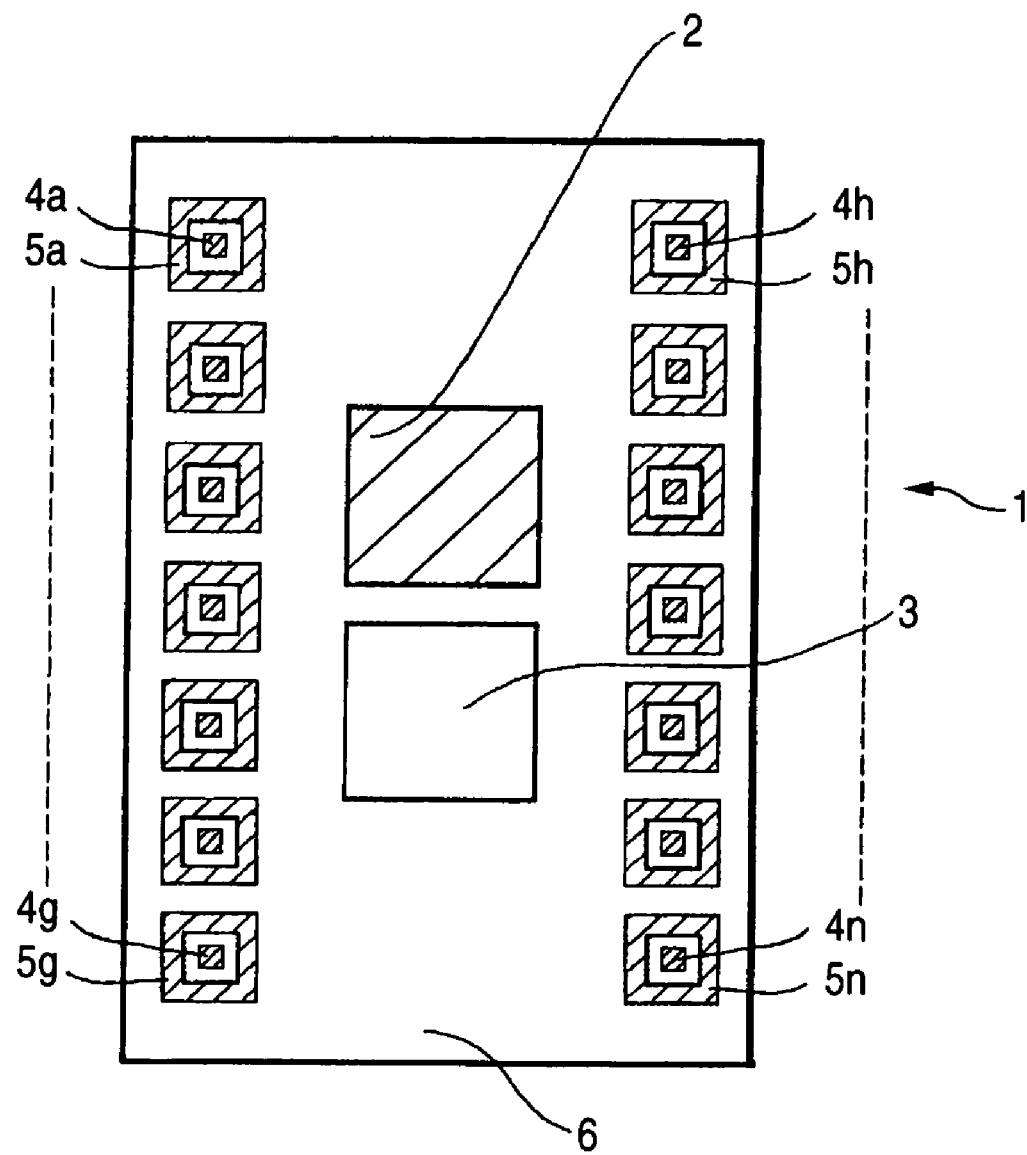
FIG. 16 is a plan view of an imaging apparatus embodying the invention.

FIG. 16 is a plan view of an imaging apparatus embodying the invention.

A light receiving portion 2 and a storage portion 3 are formed on the bare-chip board 6 of an imaging device 1 and gold-plated lands 4a-4n such as signal lines and power supply lines are provided in the vicinity of both end portions of the board 6. Seven gold-plated lands 4a-4g at the left side end and seven gold-plated lands 4h-4n at the right side end are respectively arranged in a row. Moreover, quadrilateral loop-like GND lands 5a-5n are formed so as to surround the respective gold-plated lands 4a-4n.

Figure 17:
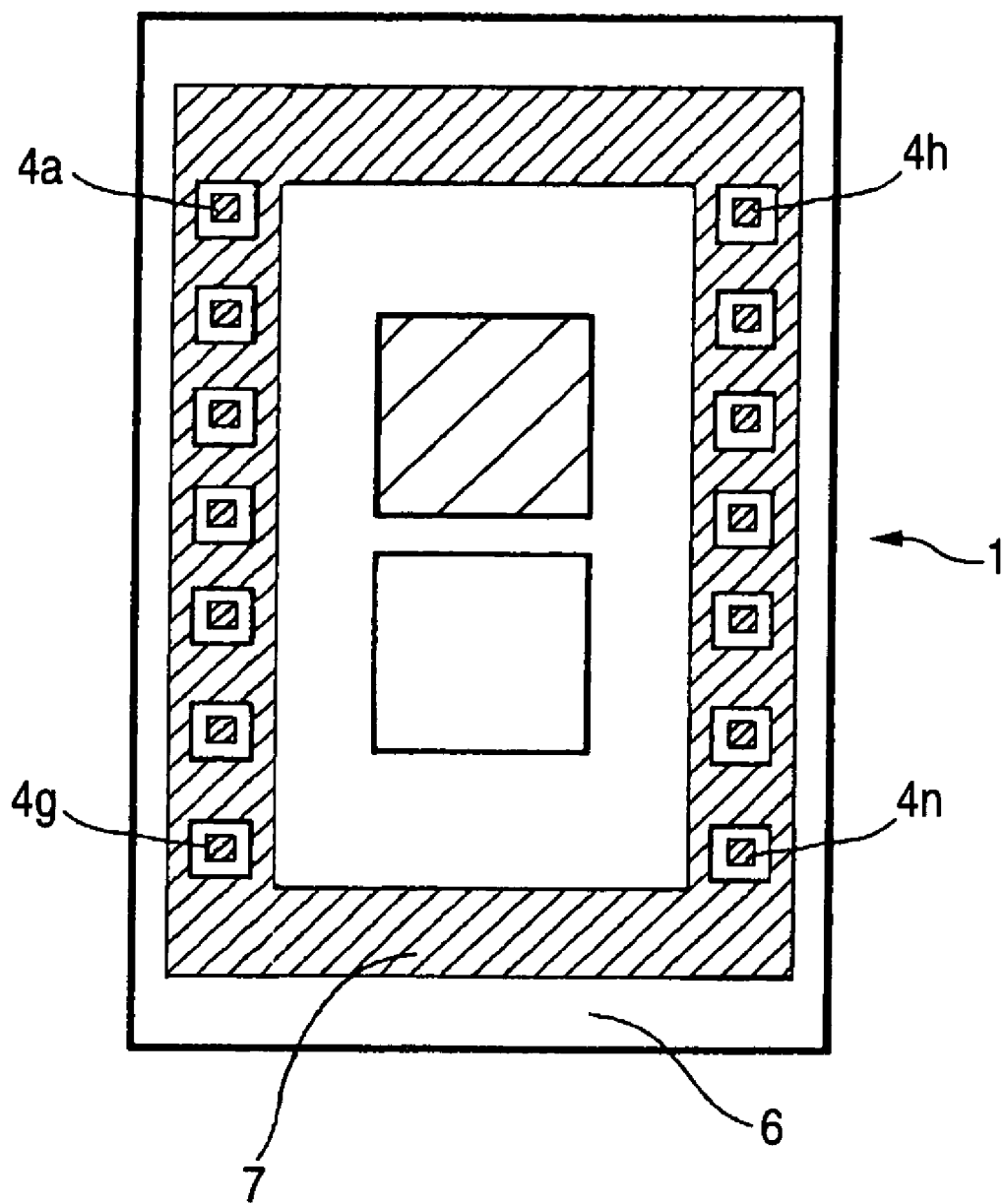
FIG. 17 is a plan view of another imaging apparatus embodying the invention.

FIG. 17 is a plan view of another imaging apparatus embodying the invention.

In this example, the GND lands 7 surrounding the respective gold-plated lands 4a-4n are reduced to and integrated into a pattern.

In comparison with the case of FIG. 16, the sealing effect is greater than separately surrounding the gold-plated lands 4a-4n. The gold-plated lands 4a-4n of FIGS. 16 and 17 are electrically connected to the light receiving portion 2 and the storage portion 3 in the inner layer portion of the bare-chip board 6 of the imaging device.

Figure 18:
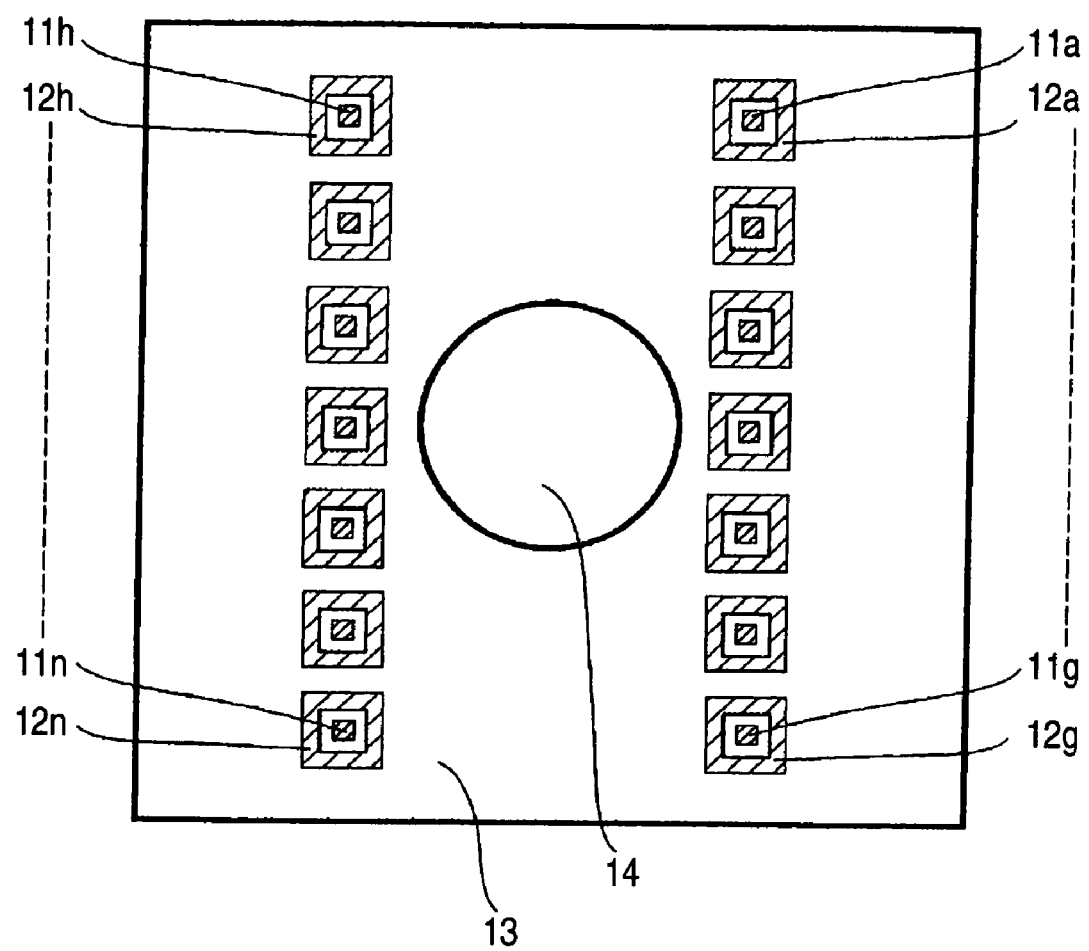
FIG. 18 is a bottom view showing an arrangement of lands on the undersurface of a multilayer board.

FIG. 18 is a bottom view showing an arrangement of lands on the undersurface of a multilayer board.

A multilayer board 13 mounted with the bare-chip board 6 of the imaging device by bare-chip packaging has a through-hole 13 for introducing incident light into the light receiving portion 2 and gold-plated lands 11h-11g are disposed in positions corresponding to the respective gold-plated lands 4a-4n of the bare-chip board 6 of the imaging device. Moreover, quadrilateral loop-like GND lands 12a-12n are formed so as to surround the respective gold-plated lands 11h-11g. The gold-plated lands 11h-11g are electrically connected to other circuit portions in the inner layer of the multilayer board and the GND lands 12a-12n are electrically connected in some other layer of the multilayer board.

Figures 19, 20:
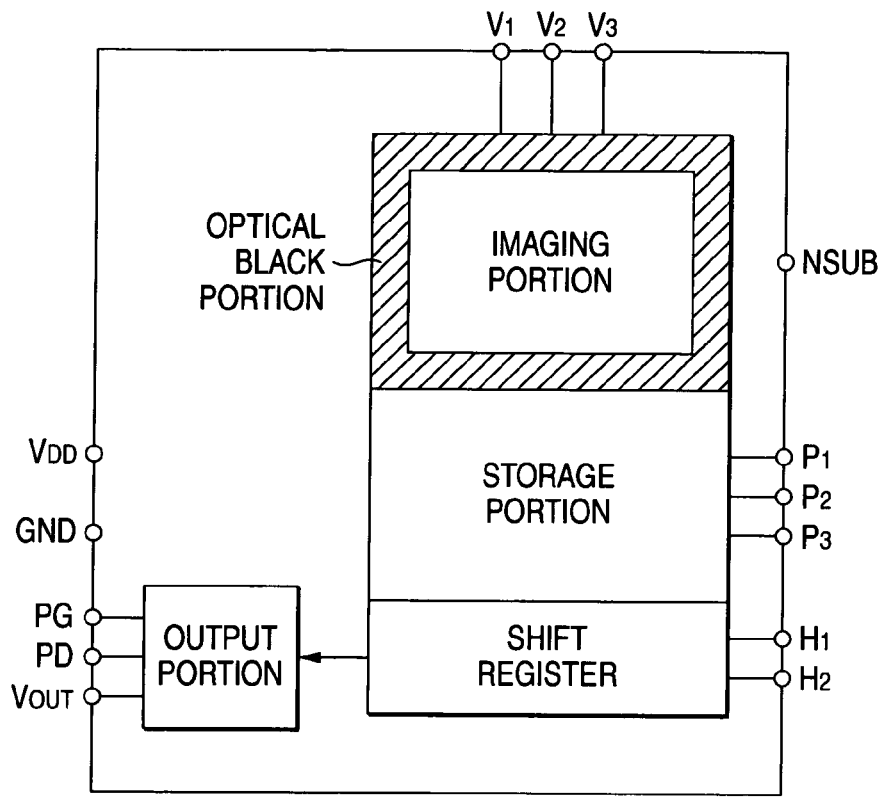
FIG. 19 is a diagram showing an arrangement of signal-line terminals of an imaging device.
FIG. 20 is a table explanatory of the terminals of an imaging device.

FIG. 19 is a diagram showing an arrangement of signal-line terminals of an imaging device and FIG. 20 is a table explanatory of the terminals of an imaging device.

Clock signals P12, P13 and P14 are input to an imaging portion 17 as the light receiving portion 2. Further, a VPW terminal is connected to the P-well of the bare-chip board 6 of the imaging device and an NSUB terminal is connected to the substrate. Some of these inputs are not shown on FIG. 19.

Clock signals PS1, PS2 and PS3 are input to a storage portion 18. Terminals P1, P2, and P3 may be used. Clock signals PH1 and PH2 of a horizontal portion are input to the horizontal shift register installed in parallel to the storage portion 18 and the output of the horizontal shift register is connected to an output portion 19. Terminals H1 and H2 may be used.

A reset gate PR, a reset drain VRD and power supply voltage VDD are connected (connection not shown) to the output portion 19 and CCD output VOUT is fed into the output portion 19. Terminals PG and PD may be used.

The gold-plated lands 4a-4n are respectively connected to the clock signals P12, P13 and P14 of the imaging portion, the reset gate PR, the reset drain VRD, the CCD output VOUT, the substrate NSUB, the clock signals PS1, PS2 and PS3 of the storage portion, the clock signals PH1 and PH2 of the horizontal portion, and the power supply voltage VDD.

Figure 21A:
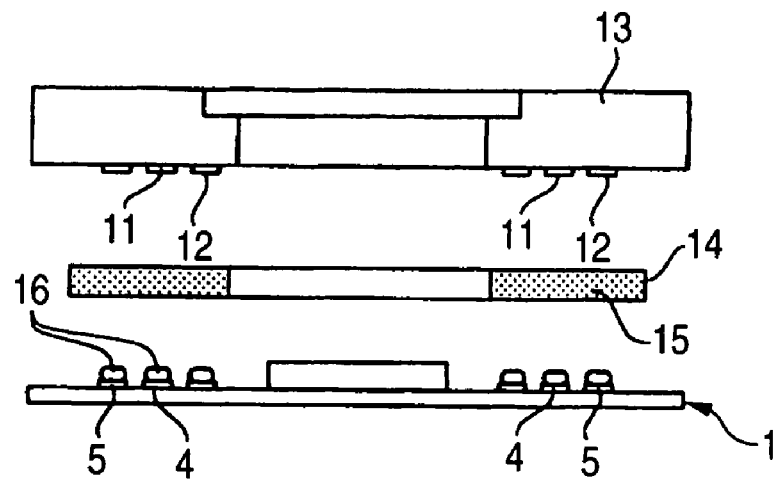
FIGS. 21A-21C are diagrams illustrating the steps of mounting the multilayer board and the imaging device board.
Figure 21B:
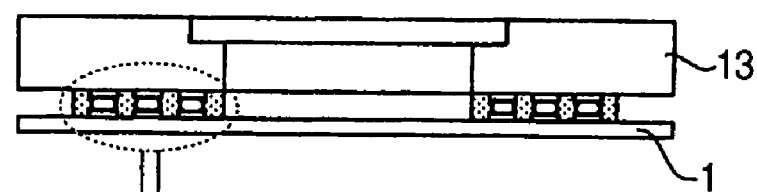
Figure 21C:
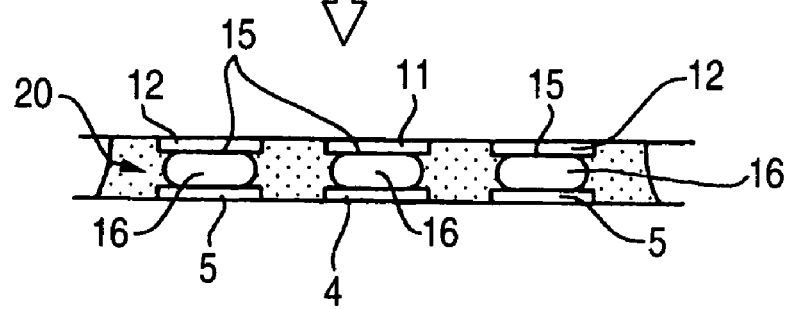

FIG. 21 shows diagrams illustrating the steps of mounting the multilayer board and the imaging device board.

A conductive sheet film 14 having conductive particles is held in the bare-chip packaging portion between the imaging device 1 with gold bumps respectively mounted on the lands 4 and the GND lands 5 and the multilayer board 13 and heat-combined therewith by pressure, whereby the conductive sheet film 14 is melted and the conductive particles are caused to stick to the gold bumps 16 and the lands 11 and 12. Then a conducting condition is created between the lands 11 and 4 and between the GND lands 12 and 5 and the flip-chip packaging is carried out, whereby the GND lands 12 and 5 are connected together and because the lands 4 and 11 are three-dimensionally and tightly shielded by the GND lands 12 and 5, the interference of some other signal from outside and the superposing of noise is prevented.

FIG. 22 is a flowchart showing the steps of mounting the imaging apparatus according to the invention.

By carrying out the flip-chip packaging using an ACF (Anisotropic Conductive Film) method, pinching heat and load are applied to the film and the loaded portion thereof is caused to selectively conduct. As shown in FIG. 23, the film in the land portion is melted by heat and a conducting condition is produced between the lands and the gold bumps with the conductive particles in the melted portion so as to maintain the other portion in an insulated condition. In case that the land-to-land pitch is extremely narrow, (micro-pitch ranging from 40 to 60 microns) is effective for flip-chip packaging.

The gold bumps are applied onto the signal lands and the GND lands of the bare-chip board of the imaging device first (Step 001. (hereinafter called S001) and S002) Subsequently, a multilayer board is prepared, and the ACF is temporarily bonded by pressure. (S003, S004 and S005).

The bare chip board of the imaging device with the addition of, the gold bumps is mounted on the multilayer board with the ACF temporarily bonded by pressure and the flip-chip bonding is carried out by applying heat and load thereto (S006). Then it is checked whether each land and each GND land are subjected to normal electrical connection (S007) and the mounting of the imaging device onto the multilayer board is terminated.

FIG. 23 shows graphs showing comparative examples of a signal from the imaging apparatus.

This signal is taken out of the CCD output 4g and is a weak signal which is subject to outside signal interference and easily affected by noise.

Figure 23A:
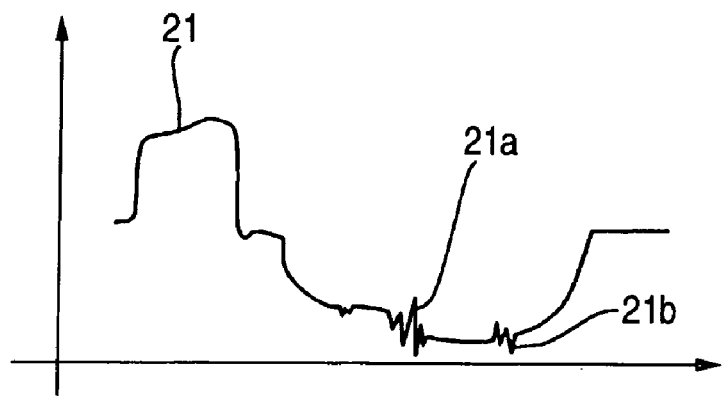
FIGS. 23A and 23B are graphs showing comparative examples of a signal from the imaging apparatus.

FIG. 23A refers to the case of normal flip-chip packaging structure and the video signal 21 of the CCD output 4g carries noise bursts 21a and 21b.

Figure 23B:
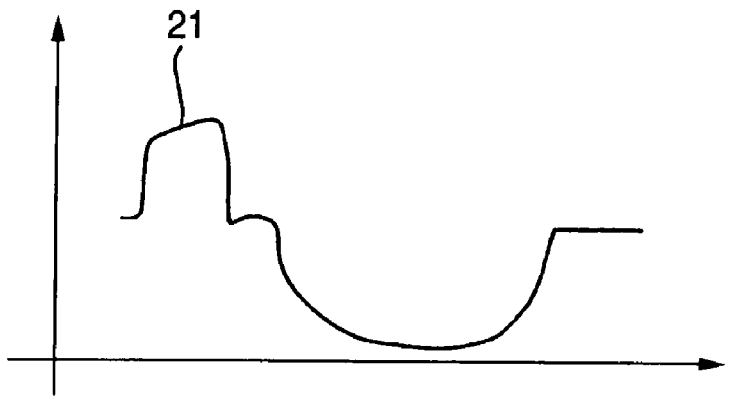
Figure 24:
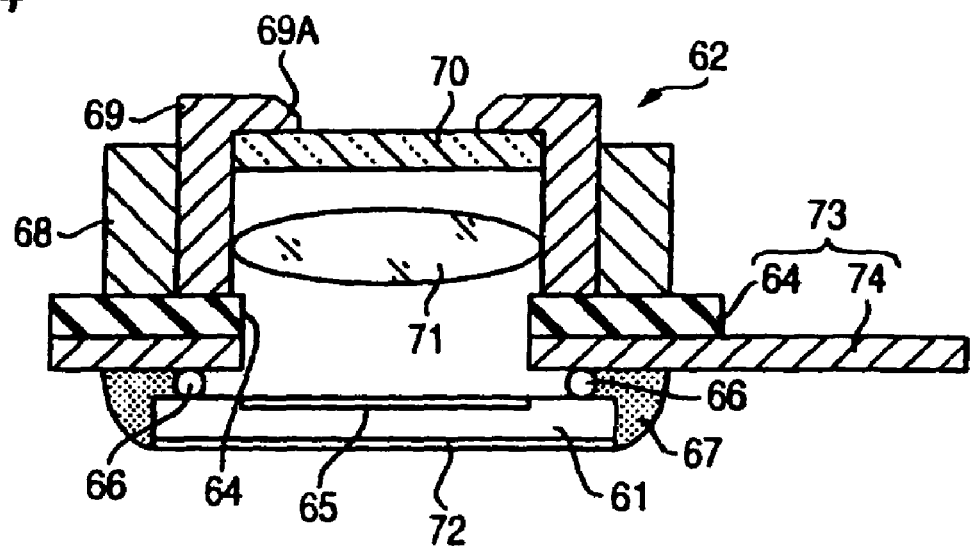
FIG. 24 is a sectional view of a conventional small-sized module camera as shown by way of example.
Figure 25:
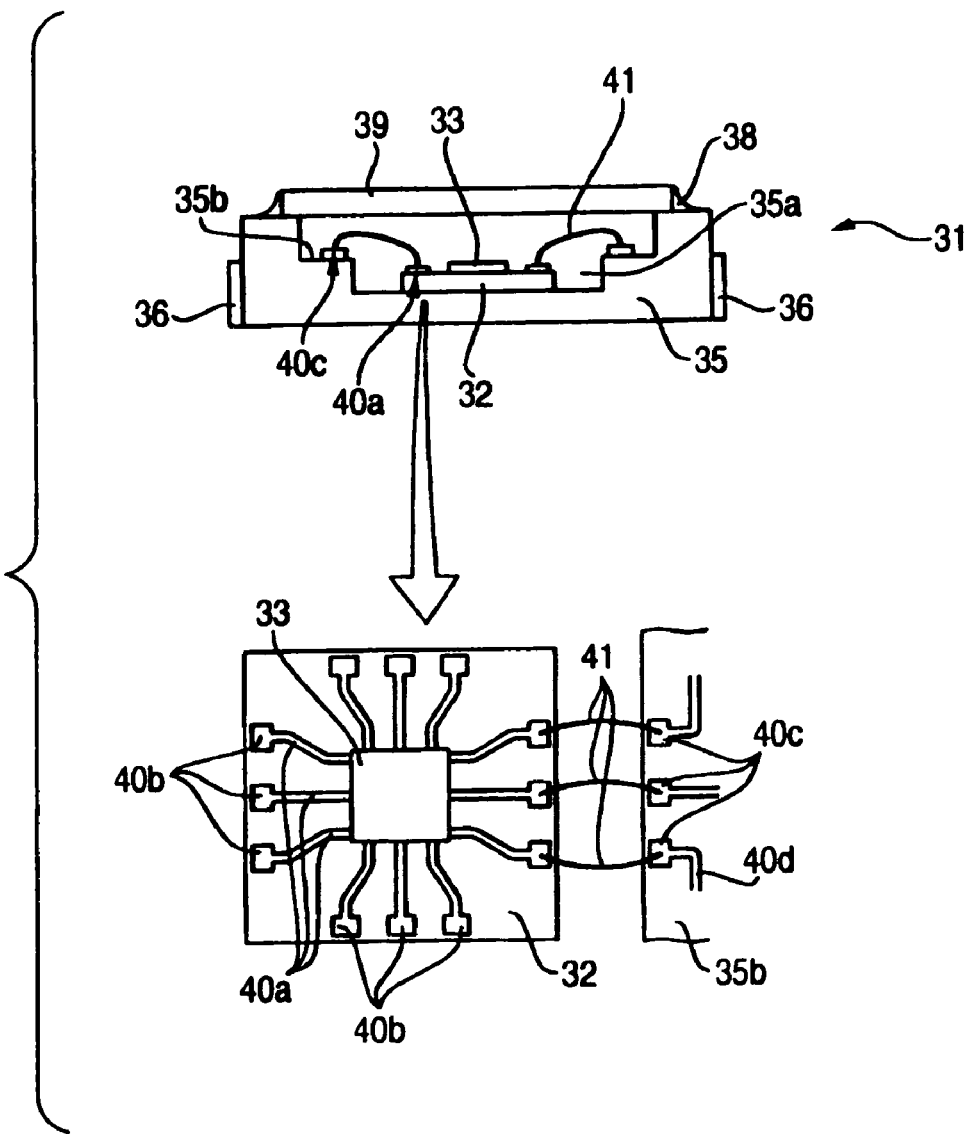
FIG. 25 is a sectional and a partial plan view of a conventional imaging device package as shown by way of example.
Figure 26:
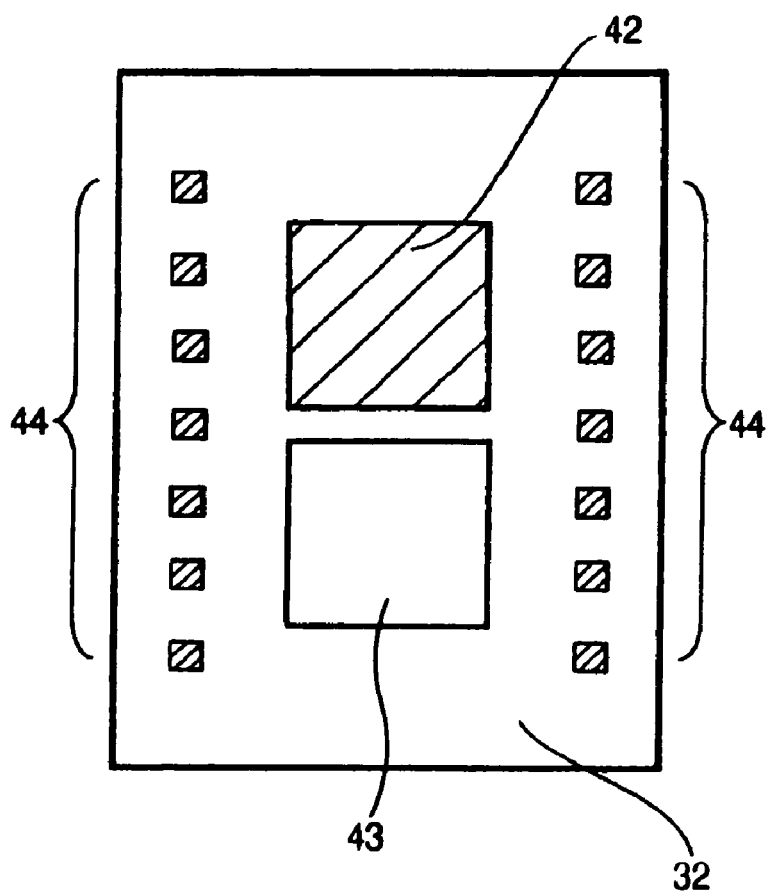
FIG. 26 is a diagram showing an arrangement of lands on the imaging device by way of example.

With the flip-chip packaging structure according to the invention, however, such noise is preventable as shown in FIG. 23B.

Although use of the multilayer board as a mother board has been described by way of example in the above embodiments of the invention, the same effect is achievable by using a flexible board.

As set forth above, according to the invention, the GND lands are provided so as to surround the lands on the imaging device side and the corresponding lands of the board as a mother board in the flip-chip packaging of the imaging apparatus, and the signal lands and the like are three-dimensionally shielded by electrically connecting the GND lands, so that interference with the adjoining lands and the superposing of noises can be prevented. Thus, a highly reliable imaging apparatus can be obtained by flip-chip packaging.

What is claimed is:

1. A small-sized module camera comprising:
    a board having a through-hole, whereby to form an optical-system containing portion for containing an optical filter and a lens on the upper side of the through-hole and an imaging-device containing portion for containing an imaging device on the lower side of the through-hole;
    the lens mounted on the top surface side of the board;
    the imaging device mounted on the undersurface side of the board and used for receiving an image which is picked up through the lens; and
    a support portion for supporting the optical filter between the optical-system containing portion and the imaging-device containing portion provided so that the support portion is projected on the imaging-device containing portion side,
    wherein the imaging device and a land portion of the board are at a portion outside the support portion of the imaging-device containing portion.

2. A small-sized module camera as claimed in claim 1, wherein the imaging device is contained in the imaging-device containing portion so that the undersurface of the imaging device is positioned inside the underside of the through-hole of the board; and
    solder lands are provided around the board.

3. A small-sized module camera as claimed in claim 1, wherein the board has a layer capable of forming electrical passive elements inside.

4. A small-sized module camera as claimed in claim 1, wherein an internal reflection preventive process is applied to the inner wall of the imaging-device containing portion.

5. A small-sized module camera as claimed in claim 1, wherein threads are respectively formed on the peripheral face of the lens and the inner wall of the imaging-device containing portion; and
    the lens is fitted to the optical-system containing portion by screwing the lens in.

* * * * *

UNITED STATES PATENT AND TRADEMARK OFFICE
CERTIFICATE OF CORRECTION

PATENT NO.        : 7,583,309 B2
APPLICATION NO.   : 10/609773
DATED             : September 1, 2009
INVENTOR(S)       : Mitsuaki Aizawa, Hiroki Itoh and Masanobu Nakai It is certified that error appears in the above-identified patent and that said Letters Patent is hereby corrected as shown below:

Title Page, Item (73)
Assignee: Should be changed from "Kyocera Coproration" to --Kyocera Corporation--.

Signed and Sealed this

Fifteenth Day of December, 2009

David J. Kappos
*Director of the United States Patent and Trademark Office*